(12) United States Patent
Aggarwal et al.

(10) Patent No.: US 12,704,678 B1
(45) Date of Patent: Aug. 11, 2026

(54) OPTICAL MULTI-CHIP INTERCONNECT BRIDGE ARCHITECTURE AND FABRICATION PROCESSES

(71) Applicant: Sicily Merger Sub II, Inc., Santa Clara, CA (US)

(72) Inventors: Ankur Aggarwal, Pleasanton, CA (US); Suresh Venkata Pothukuchi, Chandler, AZ (US); Subal Sahni, La Jolla, CA (US)

(73) Assignee: Sicily Merger Sub II, Inc., Santa Clara, CA (US)

( * ) Notice: Subject to any disclaimer, the term of this patent is extended or adjusted under 35 U.S.C. 154(b) by 0 days.

(21) Appl. No.: 19/360,176

(22) Filed: Oct. 16, 2025

Related U.S. Application Data

(60) Provisional application No. 63/785,333, filed on Apr. 8, 2025, provisional application No. 63/785,422, filed on Apr. 8, 2025.

(51) Int. Cl.

| | |
|---|---|
| ***G02B 6/124*** | (2006.01) |
| ***H10W 90/00*** | (2026.01) |
| *G02B 6/12* | (2006.01) |

(52) U.S. Cl.
CPC ............ *G02B 6/124* (2013.01); *H10W 90/00* (2026.01); *G02B 2006/12107* (2013.01)

(58) Field of Classification Search
CPC .......... G02B 6/124; G02B 2006/12107; H01L 25/167
See application file for complete search history.

(56) References Cited

U.S. PATENT DOCUMENTS

2018/0114785 A1 4/2018 Budd et al.
2019/0342026 A1 11/2019 Welch
(Continued)

OTHER PUBLICATIONS

A. Gholami, "AI and Memory Wall," Retreived from: https://www.bing.com/ck/a?!&&p=5b6d446894c8a4848c3c917ce807f614d757ebee3cd517c4f8ffd0707fabb804JmltdHM9MTc2MDU3MjgwMA&ptn=3&ver=2&hsh=4&fclid=06ee07ea-2f99-617e-03cf-14542ed660aa&psq=%5b2403.14123%5d+AI+and+Memory+Wall+-+arXiv.org&u=a1aHR0cHM6Ly9hcnhpdi5vcmcvYWJzLzI0MDMuMTQxMjM. Accessed: Oct. 16, 2025 (7 pages total).
(Continued)

*Primary Examiner* — Uyen Chau N Le
*Assistant Examiner* — Hoang Q Tran
(74) *Attorney, Agent, or Firm* — John Maldjian, Esq.; Stevens & Lee PC

(57) ABSTRACT

System in package (SiP) architectures using stitched reticle photonic integrated circuits (PICs), including a multi-die interconnect bridge (OMIB), are disclosed along with corresponding fabrication processes. A stitched multi-reticle OMIB provides an optically-enabled bridge between semiconductor dies referred to generally as XPUs where "X" is a variable representing a wide range of specialized processing units. The optically-enabled bridge enables high-speed, low-latency, and power-efficient communications using light to meet the bandwidth demands of modern artificial intelligence (AI) workloads. The disclosed SiP architectures use stacked arrangements in which the OMIBs are located directly under heat-producing elements of the XPUs. By using temperature-stable optical modulation elements, optical chip-to-chip (oC2C) interconnects between the OMIB and XPUs are able to be located at the point of compute in the XPUs without requiring access to the limited "beach-
(Continued)

front" of the die that are utilized for electrical chip-to-chip (eC2C) interconnects.

20 Claims, 30 Drawing Sheets

(56) References Cited

U.S. PATENT DOCUMENTS

| | | | | |
|---|---|---|---|---|
| 2020/0119828 | A1 | 4/2020 | Sahni | |
| 2021/0175979 | A1 | 6/2021 | De Dobbelaere et al. | |
| 2021/0271020 | A1* | 9/2021 | Islam | G02B 6/12004 |
| 2022/0199600 | A1* | 6/2022 | Zhang | H01L 25/167 |
| 2023/0377907 | A1* | 11/2023 | Wu | H01L 25/105 |
| 2024/0176169 | A1 | 5/2024 | Sahni et al. | |
| 2024/0192439 | A1* | 6/2024 | Janta-Polczynski | G02B 6/42 |

OTHER PUBLICATIONS

International Search Report and Written Opinion mailed Jan. 13, 2026, issued in connection with International Patent Application No. PCT/US2025/051389 (15 pages total).

R. Mahajan et al., "Co-Packaged Photonics For High Performance Computing: Status, Challenges And Opportunities," in Journal of Lightwave Technology, vol. 40, No. 2, pp. 379-392, Jan. 15, 15, 2022, doi: 10.1109/JLT.2021.3104725. (14 pages total).

Das Sharma, D., Mahajan, R.V. Advanced packaging of chiplets for future computing needs. Nat Electron 7, 425-427 (2024). https://doi.org/10.1038/s41928-024-01175-3. (3 pages total).

S. Sahni et al., "Beyond the Beachfront: Integration of Silicon Photonic I/Os under a High-Power ASIC," Optical Fiber Communications Conference and Exposition (OFC), (2024) (3 pages total).

Y. -C. Hu et al., "CoWoS Architecture Evolution for Next Generation HPC on 2.5D System in Package," 2023 IEEE 73rd Electronic Components and Technology Conference (ECTC), Orlando, FL, USA, 2023, pp. 1022-1026, doi: 10.1109/ECTC51909.2023.00174. (5 pages total).

T. Braun, O. Holck, M. Obst, S. Voges, R. Kahle, L. Böttcher, M. Billaud, M. Topper, K.-F. Becker, R. Aschenbrenner, M. Voitel, M. SchneiderRamelow; Panel Level Packaging—Where are the Technology Limits?; Proc. of ECTC 2022, San Diego, USA. (12 pages total).

T. Braun, M. Böttcher, M. Schiffer, H. Pötter, C. Brockmann, K.-F. Becker, D. Freimund, M. Schneider-Ramelow; Universal IoT Sensor Platform based on a FOWLP RDL first Approach; Proc. of IMAPS Device Packaging Conference (DPC) 2021 (32 pages total).

T. Braun et al., "How to Manipulate Warpage in Fan-out Wafer and Panel Level Packaging," 2024 IEEE 74th Electronic Components and Technology Conference (ECTC), Denver, CO, USA, 2024, pp. 1-6, doi: 10.1109ECTC51529.2024.00008. (6 pages total).

* cited by examiner

TABLE I. LIMITATIONS OF CURRENT COPPER INTERCONNECTS AND CURRENT PHOTONICS SOLUTIONS COMPARED TO OMIB SiP

| | | Current copper SOTA | | Current photonic SOTA | | Present OMIB SiP |
|---|---|---|---|---|---|---|
| **Metrics** | | **In package** | **Package-to-package** | **In package** | **Package-to-package** | **In-package and package-to-package** |
| Reach ↑ | Signal integrity | Signal integrity ↓ | Signal integrity ↓ | SOTA solution not available | Good | Excellent |
| Reach ↑ | Thermal sensitivity | Effects of thermal resistance ↑ | Effects of thermal resistance ↑ | SOTA solution not available | Limited: cannot be placed near high-temp IC | None |
| Reach ↑ | Enery efficiency | Power consumption ↑ | Power consumption ↑ | SOTA solution not available | Good | High |
| Reach ↑ | Latency | Latency ↓ | Latency ↓ | SOTA solution not available | Good | Extremely low |
| Bandwidth | | High - limited to the beachfront | High - limited to the beachfront | SOTA solution not available | Limited to the beachfront | Extremely high - not limited to the beachfront |

Fiber bundle 590
FAU
585
Si/Glass block (580)
575
510
525
520
Organic substrate
570
MUX/ DEMUX
OMIB
505
EIC
535
TIA 550
PD 560
530
568
Driver 555
EAM 565
TC 548
Router 545
Electrical bridge 515
XPU
540

500

600
Fiber bundle 690
FAU
685
Si/Glass block (580)
675
610
625
620
670
MUX/ DEMUX
OMIB
Organic substrate
605
635
Embedded AMS block
TIA 650
PD 660
630
Driver 655
EAM 665
668
TC 648
Router 645
I/F 642
XPU
640

640
610
Heat 652
Heat producing elements
Optical elements e.g., transceiver (668)

700

700

700

700

1200

1200
= HBM, XPU, chiplet, etc.
Organic interposer (1235)
oC2C interconnects (1230-2)
XPU 1220-2
eC2C interconnects (805)
810
XPU 1220-4
1230-4
Fiber optics 1215
OMIB (1202)
FAU
FAU
FAU
1215
1230-1
XPU 1220-1
XPU 1220-3
1230-3
OMIB (1202)
1210
1230
1305
1305

700

1200
1215
FAU
1210
FAU
oC2C
interconnects
(1230-2)
XPU
1220-2
XPU
1220-4
1230-4
Photonic
network (1505)
XPU
1220-1
1230-1
XPU
1220-3
1230-3
Photonic path
(1510)
OMIB (1202)

Logical photonic path

XPU

1600

1610

Photonic network (1605)

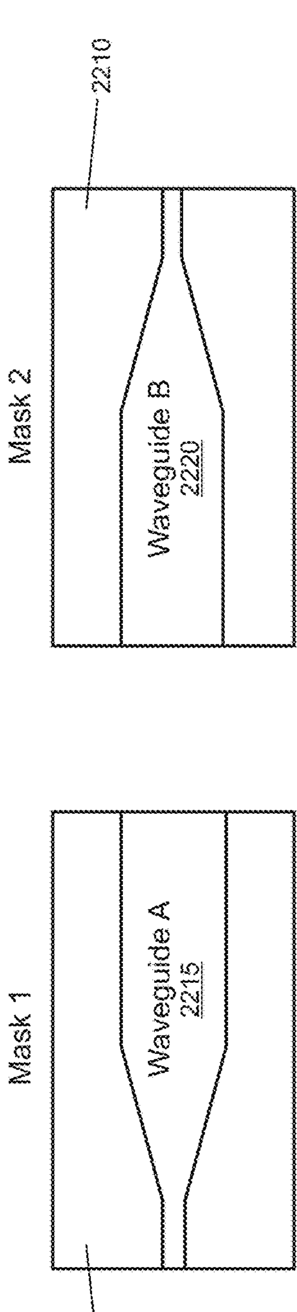
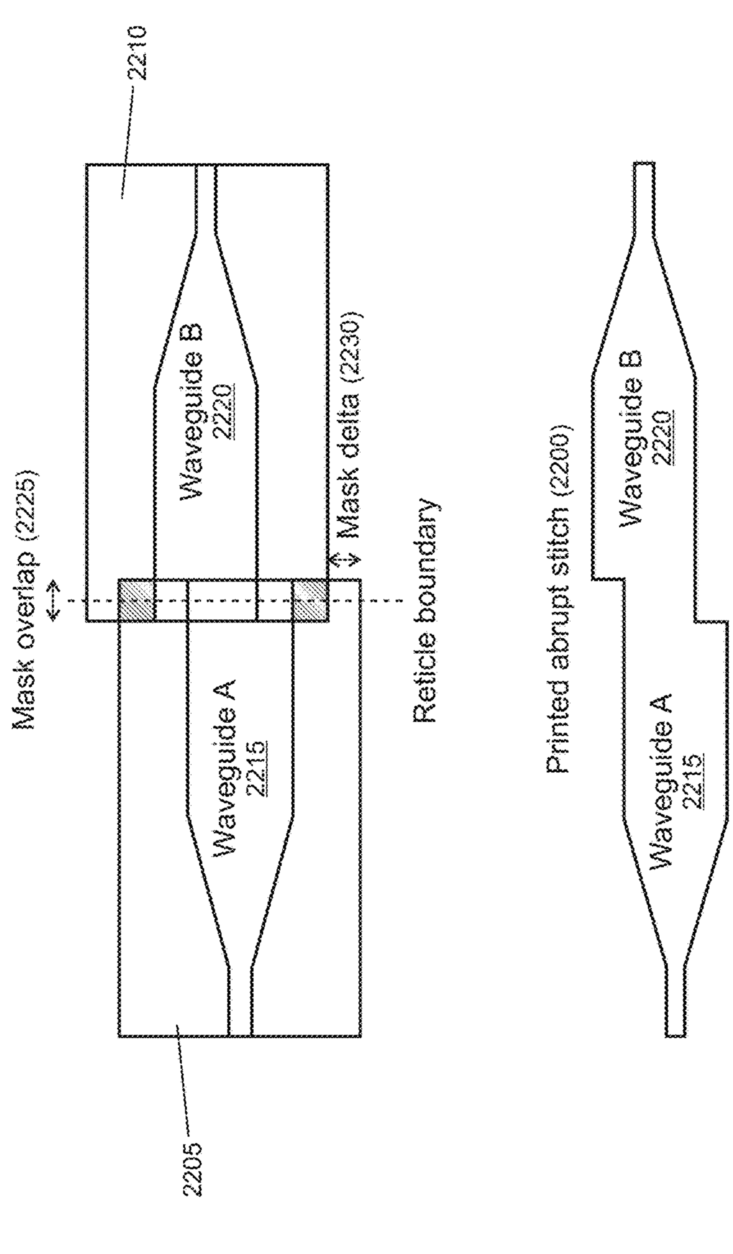
*FIG 22*

FIG 23
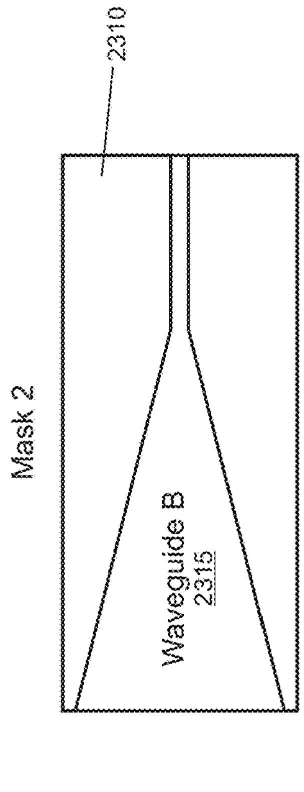
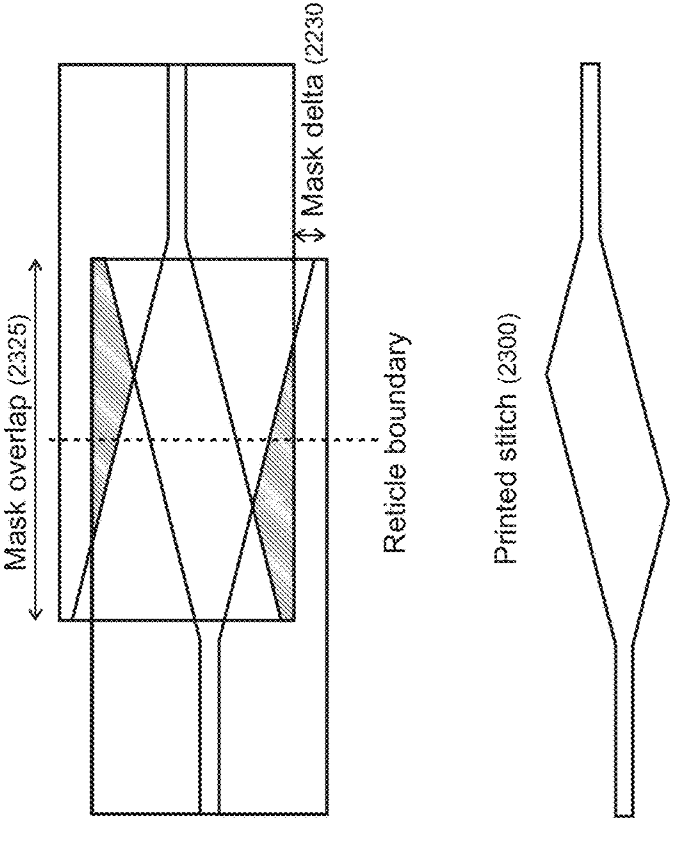
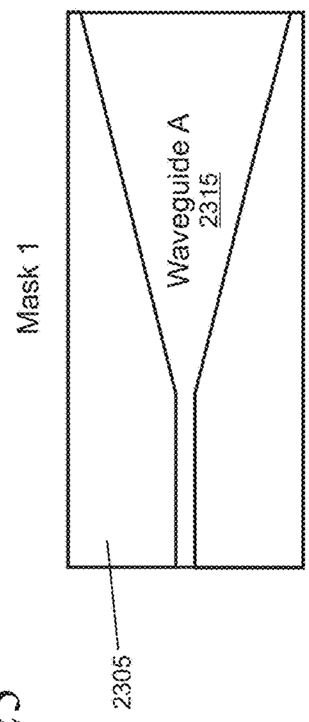

2400
Fiber bundle (2460)
FAU (2455)
Grating coupler (2445)
Stiffener ring 2435
Organic interposer (2425)
Si/glass block (2450)
EIC 2410
OMIB (2415)
Electrical bridge (2420)
XPU 2405
Deep trench capacitors (DTC) (2440)
Package substrate 2430

2400

2600

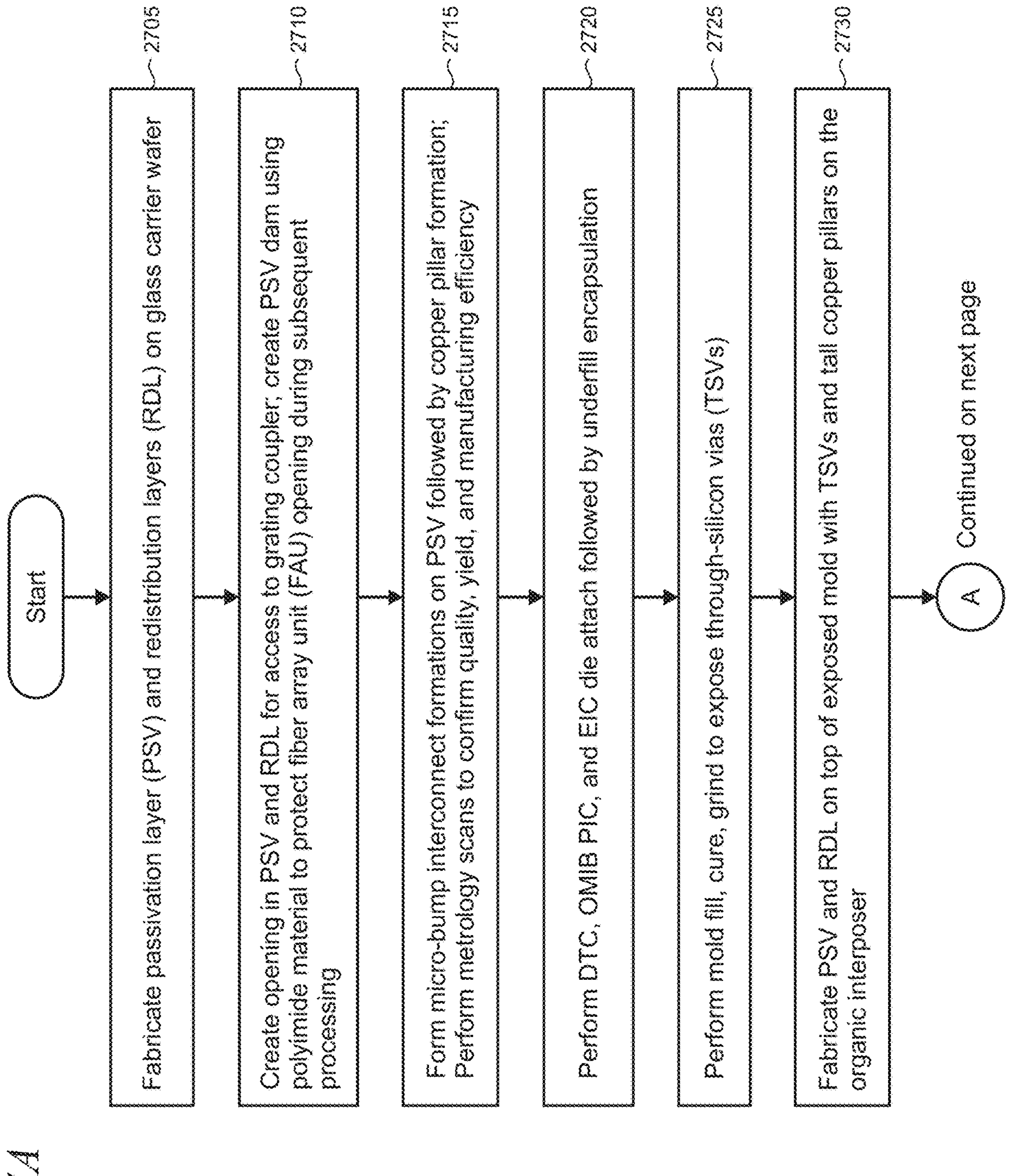
FIG 27A
2700
Start
Fabricate passivation layer (PSV) and redistribution layers (RDL) on glass carrier wafer
2705
Create opening in PSV and RDL for access to grating coupler, create PSV dam using polyimide material to protect fiber array unit (FAU) opening during subsequent processing
2710
Form micro-bump interconnect formations on PSV followed by copper pillar formation; Perform metrology scans to confirm quality, yield, and manufacturing efficiency
2715
Perform DTC, OMIB PIC, and EIC die attach followed by underfill encapsulation
2720
Perform mold fill, cure, grind to expose through-silicon vias (TSVs)
2725
Fabricate PSV and RDL on top of exposed mold with TSVs and tall copper pillars on the organic interposer
2730
A
Continued on next page

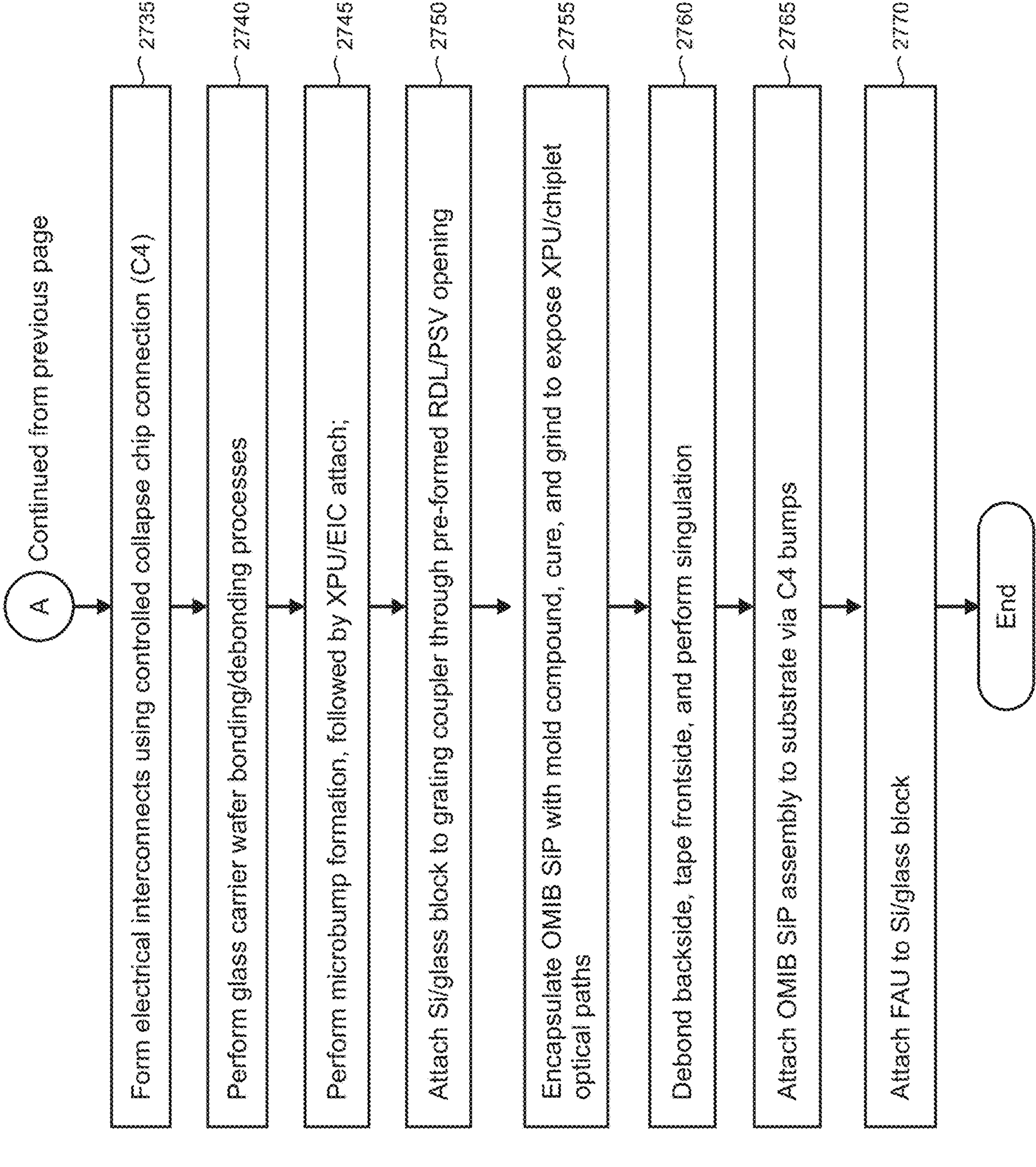
FIG 27B
2700
A
Continued from previous page
Form electrical interconnects using controlled collapse chip connection (C4)
2735
Perform glass carrier wafer bonding/debonding processes
2740
Perform microbump formation, followed by XPU/EIC attach;
2745
Attach Si/glass block to grating coupler through pre-formed RDL/PSV opening
2750
Encapsulate OMIB SiP with mold compound, cure, and grind to expose XPU/chiplet optical paths
2755
Debond backside, tape frontside, and perform singulation
2760
Attach OMIB SiP assembly to substrate via C4 bumps
2765
Attach FAU to Si/glass block
2770
End 2810
2820
2815
2825
2830
2805

2800
2915
2810
2910
2905
2815
2820
2830
2805

2800

2800

3110
3105
2910
2915
3005
2815
2905
2805
2810

2800

2800

2800

2800

2800

OPTICAL MULTI-CHIP INTERCONNECT BRIDGE ARCHITECTURE AND FABRICATION PROCESSES

CROSS REFERENCES TO RELATED APPLICATIONS

This application claims priority to U.S. provisional patent application Ser. No. 63/785,422 entitled "Optical Multi-Chip Interconnect Bridge (OMIB) Interposer Assembly Process to Enable High-Density Photonic Interconnects for High-Performance Computing Applications" and filed on Apr. 8, 2025. This application further claims priority to U.S. provisional patent application Ser. No. 63/785,333 entitled "Method of Fabrication of Optical Multi-Chip Interconnect Bridge (OMIB) Interposer Assembly Process to Enable High-Density Photonic Interconnects for High-Performance Computing Applications" and filed on Apr. 8, 2025.

BACKGROUND

Processing artificial intelligence (AI) workloads typically involves specialized hardware. Typical hardware bridges two integrated circuits (i.e., chips) with an electrical interconnect. The electrical interconnect consumes high power, has pin count limitations, and can only bring data to the edge of the chip (commonly referred to as the "beachfront" of the chip). For points of compute in a central region of the chip, extra distance is required for signals to travel to the edge of the chip to communicate with resources that are external to the chip. This is highly inefficient and makes it difficult for AI computing hardware to keep up with the demands required by an AI application.

SUMMARY

System in package (SiP) architectures using stitched reticle photonic integrated circuits (PICs), including a multi-die interconnect bridge (OMIB), are disclosed along with corresponding fabrication processes. A stitched multi-reticle OMIB provides an optically-enabled bridge between semiconductor dies such as central processing units (CPUs), graphic processing units (GPUs), neural processing units (NPUs) and the like (referred to generally as XPUs where "X" is a variable representing a wide range of specialized processing units). The optically-enabled bridge enables high-speed, low-latency, and power-efficient communications using light to meet the bandwidth demands of modern artificial intelligence (AI) workloads. The disclosed SiP architectures use stacked arrangements in which the OMIBs are located directly under heat-producing elements of the XPUs. By using temperature-stable optical modulation elements, optical chip-to-chip (oC2C) interconnects between the OMIB and XPUs are able to be located at the point of compute in the XPUs without requiring access to the limited "beachfront" at the perimeter edges of the die that is utilized for electrical chip-to-chip (eC2C) interconnects.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. Furthermore, the claimed subject matter is not limited to implementations that solve any or all disadvantages noted in any part of this disclosure.

DESCRIPTION OF THE DRAWINGS

FIG. 1 shows a table showing limitations of current copper interconnects and current photonics solutions compared to the present multi-die interconnect bridge (OMIB) system-in-package (SiP);

FIG. 22 shows an illustrative approach to waveguide reticle stitching using an abrupt stitch;

FIG. 23 shows an illustrative approach to waveguide reticle stitching using an angled stitch;

FIGS. 27A and 27B show a flowchart of an illustrative assembly process flow for an OMIB SiP.

Like reference numerals indicate like elements in the drawings. Elements are not drawn to scale in the drawings.

DETAILED DESCRIPTION

Figure 2:
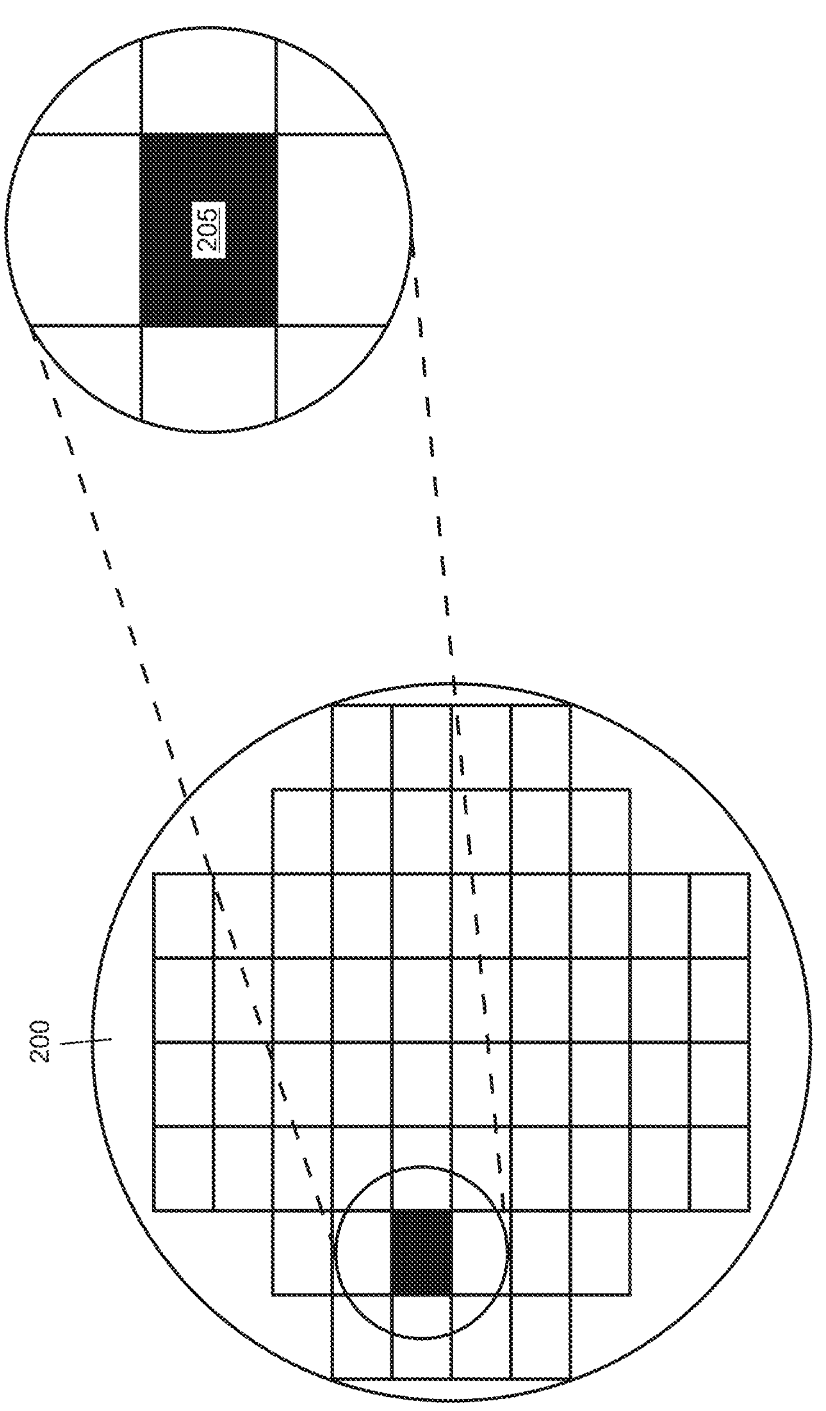
FIG. 2 is a top view of a wafer and a die that may include, or be included in, one or more microelectronic packages with an OMIB, in accordance with various implementations.

As explosive growth in AI model size strains traditional data center infrastructure, there is a huge demand for compute and memory bandwidth/capacity at low latencies. Optical interconnects, co-packaged with compute, have been established as the power efficient, high bandwidth solution needed for the next generation performance scaling. Co-packaged optics solutions are essential to relieve the compute, memory and network system infrastructure chokepoints, but are traditionally limited by compute beachfront. Photonic fabric has emerged as a pioneering optical compute and memory fabric solution for scale-up networking.

Photonic fabric is a subset or architectural implementation within photonic networking. It refers to a highly integrated, scalable, and often reconfigurable optical interconnect layer that enables low-latency, high-bandwidth communication, usually within or between data center racks, server clusters, or even within single-package multi-die systems. Photonic fabric can provide a full-stack solution for interconnecting compute nodes (e.g., XPUs in which "X" stands for any compute architecture that is optimal for a given application) using photonics, incorporating switching, signal processing, and packaging advancements that together act as the "fabric" for communication Photonic fabric has no beachfront limitations and can deliver data directly to the point of compute in the XPU. This feature of the photonic fabric typically results in 25 times greater bandwidth for XPU-XPU and XPU-memory optical connectivity, while reducing latency and power consumption by up to 10 times compared to current solutions.

Next generation high-bandwidth scale-up networks are fueled by advanced packaging architectures. Heterogeneous integration of chiplets is the proven path for such advanced packaging solutions. As those SiP solutions scale toward increasing heterogeneous integration and complexity, future scaling is limited by electrical reach, bandwidth, latency, energy efficiency, package form factor, and thermal management issues. OMIB SiP architectures, as presently disclosed herein, can provide optical connectivity to point-of-compute by breaking the beachfront limitation and provide a pathway to high bandwidth networks.

As future high performance packages trend toward organic interposers integrated with local silicon bridges that can package multiple XPUs, this disclosure discusses OMIB and organic interposer architectures and related fabrication processes that enable future bandwidth scaling. An OMIB SiP is a key building block for the photonic fabric to supercharge the scale-up AI infrastructure for accelerated computing.

Turning now to the drawings, Table 1 in FIG. 1 shows the limitations of current state-of-the-art (SOTA) copper interconnects and photonics solutions compared to the present OMIB SiP solution. As shown, the present OMIB SiP solution provides huge advantages by providing high bandwidth while greatly reducing input/output (I/O) latency and power consumption. As discussed in more detail below, the disclosed OMIB SiP architectures provide these advantages due to optical interconnect functionalities being directly embedded in the XPU or an EIC (electrical integrated circuit) layer of the SiP, while the thermally stable optical modulation elements are located directly underneath the XPU/EIC in the photonic integrated circuit (PIC) layer if the SiP.

FIG. 2 is a top view of a wafer 200 and die 205 that may include, or be included in, an SiP with an OMIB, in accordance with various implementations. The wafer may be composed of semiconductor material and may include one or more dies having integrated circuit structures formed on a surface of the wafer. Each of the dies may be a unit of a semiconductor product that includes a suitable IC. After the fabrication of the semiconductor product is complete, the wafer may undergo a singulation process in which the dies are separated from one another to provide discrete "chips" of the semiconductor product. A die, and typically at least one other die, may be included in a SiP with an OMIB.

The present OMIB can be formed in a second process using a second wafer (not shown) in a manner analogous to the fabrication of the die 205. The OMIB is an implementation of an optically-enabled bridge that facilitates photonic signal transmission among semiconductors dies such as XPUs, EICs, and chiplets. The OMIB is a PIC and has optical components fabricated therein, as opposed to the die 205 which is an EIC that typically has electronic elements fabricated therein. The OMIB can be attached to or embedded in a package substrate to form an organic interposer, as discussed below. The package substrate may be considered to be a cored or coreless substrate. The package substrate may include one or more layers of a dielectric material which may be organic or inorganic.

The package substrate may further include one or more conductive elements such as vias, pads, traces, microstrips, strip lines, redistribution layers, and the like. The conductive elements may be internal to, or on the surface of, the package substrate. Generally, the conductive elements may allow for the routing of signals through the package substrate or between elements coupled to the package substrate. In various implementations the package substrate may be, for example, a printed circuit board (PCB), an interposer, a motherboard, or some other type of substrate.

Figure 3:
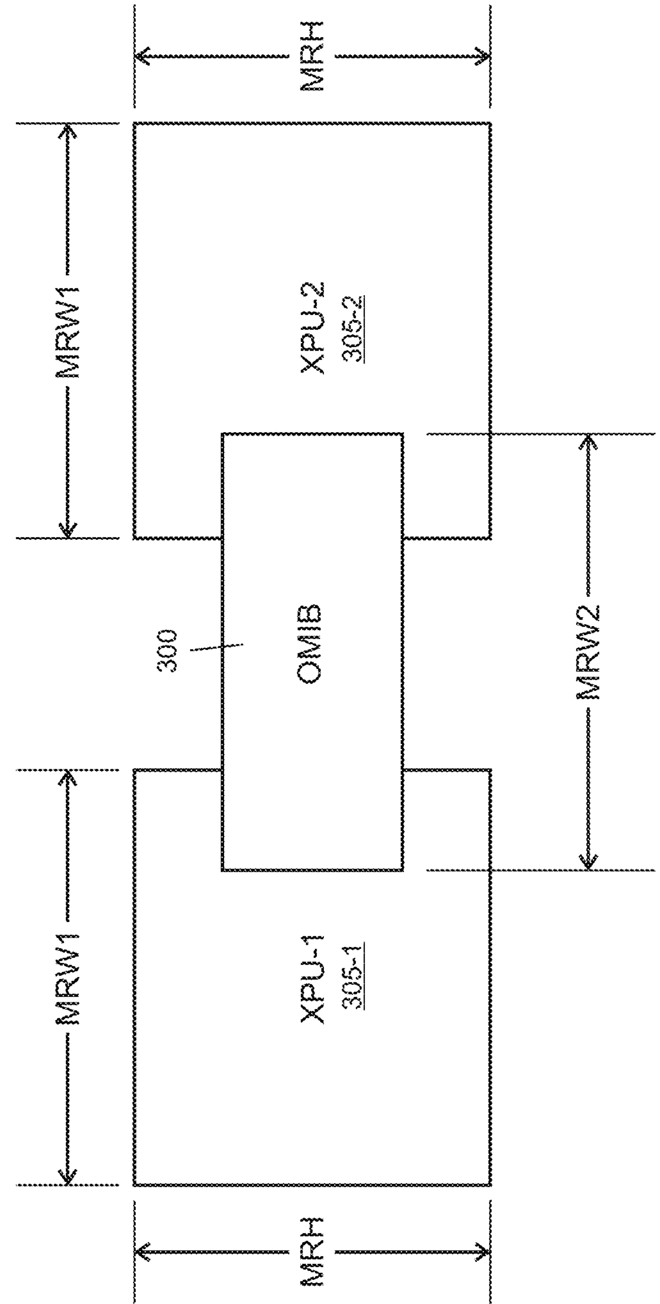
FIG. 3 shows an illustrative OMIB providing an optically-enabled bridge for two XPU dies.

FIG. 3 shows an illustrative OMIB 300 that bridges two XPU dies 305-1 and 305-2. In some exemplary implementations, the OMIB formed in a second fabrication process may share one dimension with each die 305 (horizontal or vertical) that was formed in a first fabrication process. The die may be as large as possible, for example, in some implementations, within the size limits of a reticle that is used to manufacture it.

The dies 305 have a width that corresponds to the maximum reticle width MRW1 of an EIC reticle and a height that corresponds to the maximum reticle height MRH of an EIC reticle, and the OMIB 300 has a width that corresponds to the maximum reticle width MRW2 of a PIC reticle. The choice of particular die size may be for convenience and cost-savings during fabrication and is not limiting on the various inventive embodiments described herein.

Figure 4:
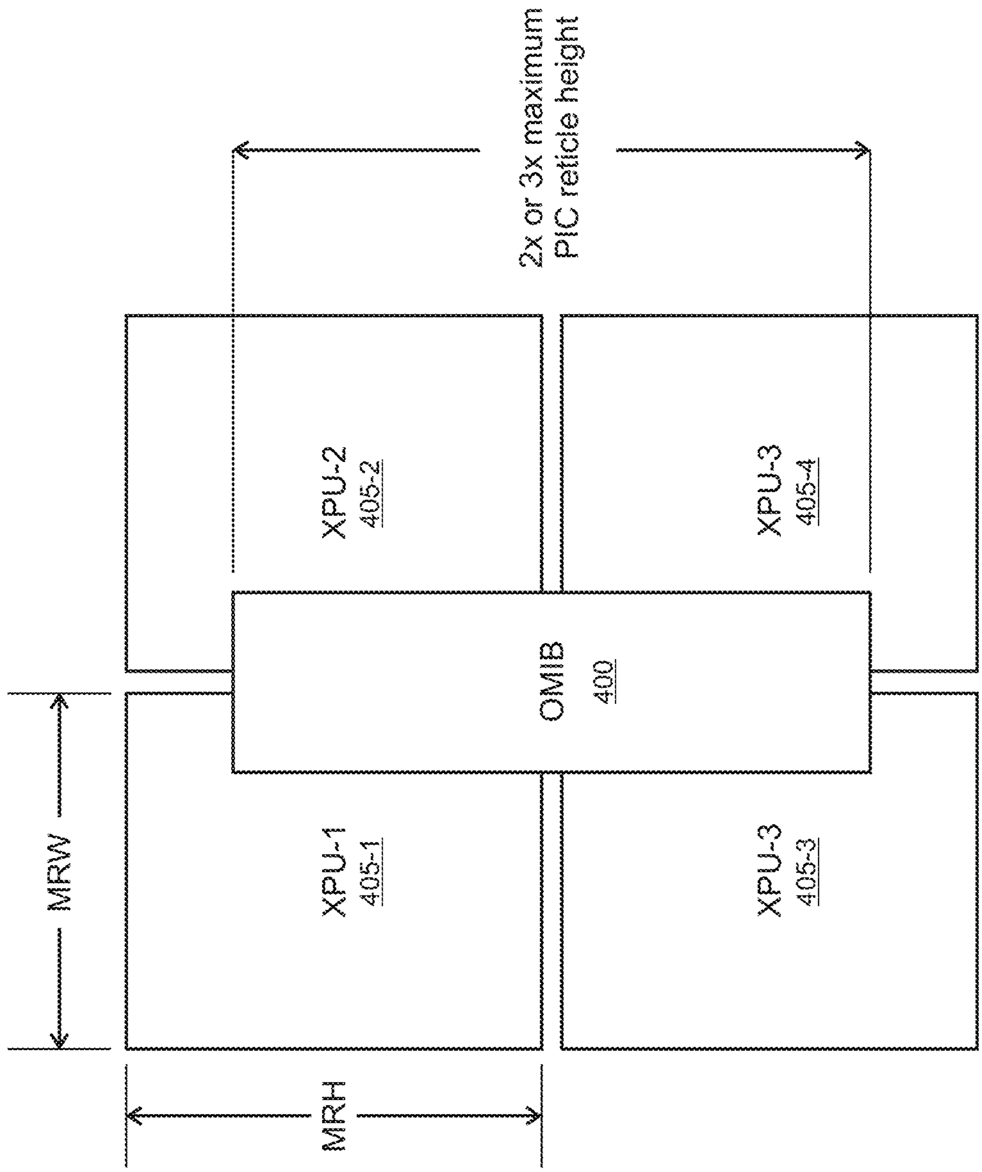
FIG. 4 shows an illustrative OMIB providing an optical bridge for two dies.

In contrast to the arrangement shown in FIG. 3, an OMIB 400 shown in FIG. 4 uses a stitched reticle design as it is too large to be produced with a single reticle. For example, the OMIB may use two or three stitched reticles as required to meet the needs of particular application with one or multiple stitch boundaries. In FIG. 4, the OMIB is used to bridge four XPU dies 405-1, 405-2, 405-3, and 405-4, as shown.

Figure 5:
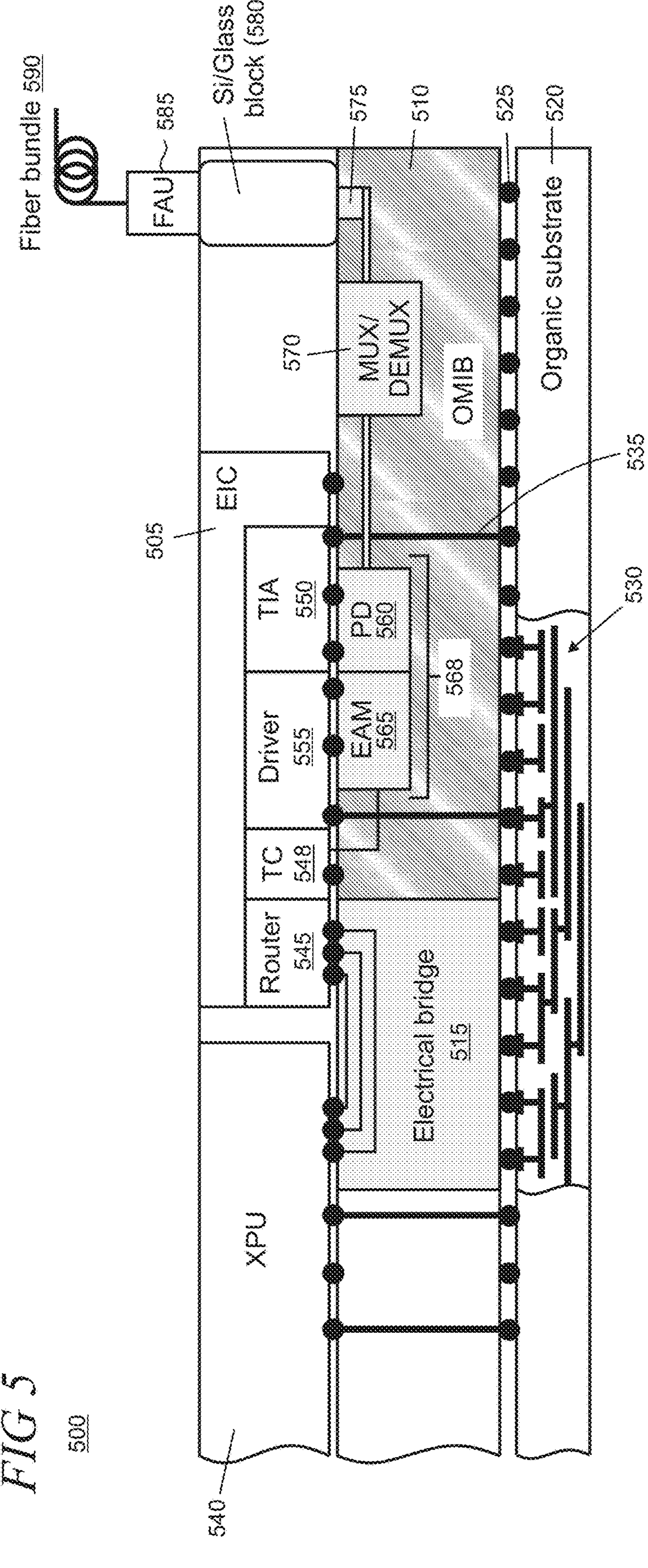
FIG. 5 is an elevation view of a portion of an illustrative OMIB SiP that includes a separate electronic integrated circuit (EIC)

Stitched reticle OMIB designs are utilized in various OMIB SiP embodiments in accordance with the present principles as disclosed herein. FIG. 5 is an elevation view of a portion of an illustrative OMIB SiP 500. In this example, an EIC 505 is stacked in the SiP above the OMIB 510. Both the OMIB and an electrical bridge 515 are disposed on an organic substrate 520 via electrical interconnects 525 such as microbumps. In alternative embodiments, the OMIB and/or electrical bridge are directly integrated in the organic substrate. The combination of electrical and/or optical bridges and organic substrate may be referred to as an organic interposer. The OMIB, organic substrate and/or interposer typically include various combinations of redistribution layers and through-silicon copper pillars, as respectively indicated by reference numerals 530 and 535.

The electrical bridge 515 couples compute elements in an XPU 540 to the EIC 505 via suitable components, for example, a router 545. The router forms digital packets that include message requests from compute elements. The EIC includes an transimpedance amplifier (TIA) 550 and modulator driver 555 that respectively interoperate with respective optical devices such as a photodetector (PD) 560 and electro-absorption modulator (EAM) 565 in the OMIB 510. The TIA and modulator drivers in the EIC interoperate with the corresponding PD and EAM via electrical interconnects such as microbumps or other suitable interconnect devices or technologies. The EIC may include other elements such as a serializer/deserializer (SerDes) block (not shown) in some implementations.

A thermal control (TC) block 548 is optionally utilized in some embodiments to provide control signals to the EAM 565. The TC block provides a voltage input to the EAM as needed to extend its operating range depending on the current thermal conditions in the OMIB 510. The configuration and operation of the TC block is described in U.S. patent application Ser. No. 18/123,170, the disclosure of which in incorporated by reference herein having the same effect as if set forth in length in its entirety. In various embodiments, the TC block implements a thermal control loop to apply a voltage (e.g., bias voltage) to the EAM in response to a changing thermal condition in the OMIB. In this manner, the voltage application causes the EAM to operate as if its thermal temperature conditions were near what they would experience at maximum load, even if the actual temperature in that region is cooler and/or outside the normal thermal range of the EAM (e.g., absent the provided voltage signal). Moreover, the temperature range of the EAM is extended via the added voltage even though the temperature conditions may have exceeded the operating range of the device.

An exemplary optical device that utilizes combination of EAM 560 and PD 565 is a photonic transceiver (indicated by reference numeral 568). An OMIB typically includes multiple transceivers that are respectively optically coupled to multiple waveguides arranged in a photonic network to facilitate optical communications. Such communications may include inter-package communications (e.g., optical communications among the dies) and/or off-package communications with external devices and/or systems. The OMIB further includes a multiplexer/demultiplexer 570 and grating coupler 575. The transceiver is coupled, via appropriate paths in the photonic network in the OMIB, to the multiplexer/demultiplexer which is configured for wavelength division multiplexing (WDM) and is further coupled to the grating coupler. The grating coupler in the OMIB interfaces with an optically transparent silicon (Si) or glass block 580 (or a block comprising a combination of Si and glass) which is coupled to a fiber array unit (FAU) 585 and fiber bundle 590. The FAU and fiber bundle are connectable to an external light engine and may further be utilized to support off-package communications with external systems and/or devices.

Figures 6A, 6B:
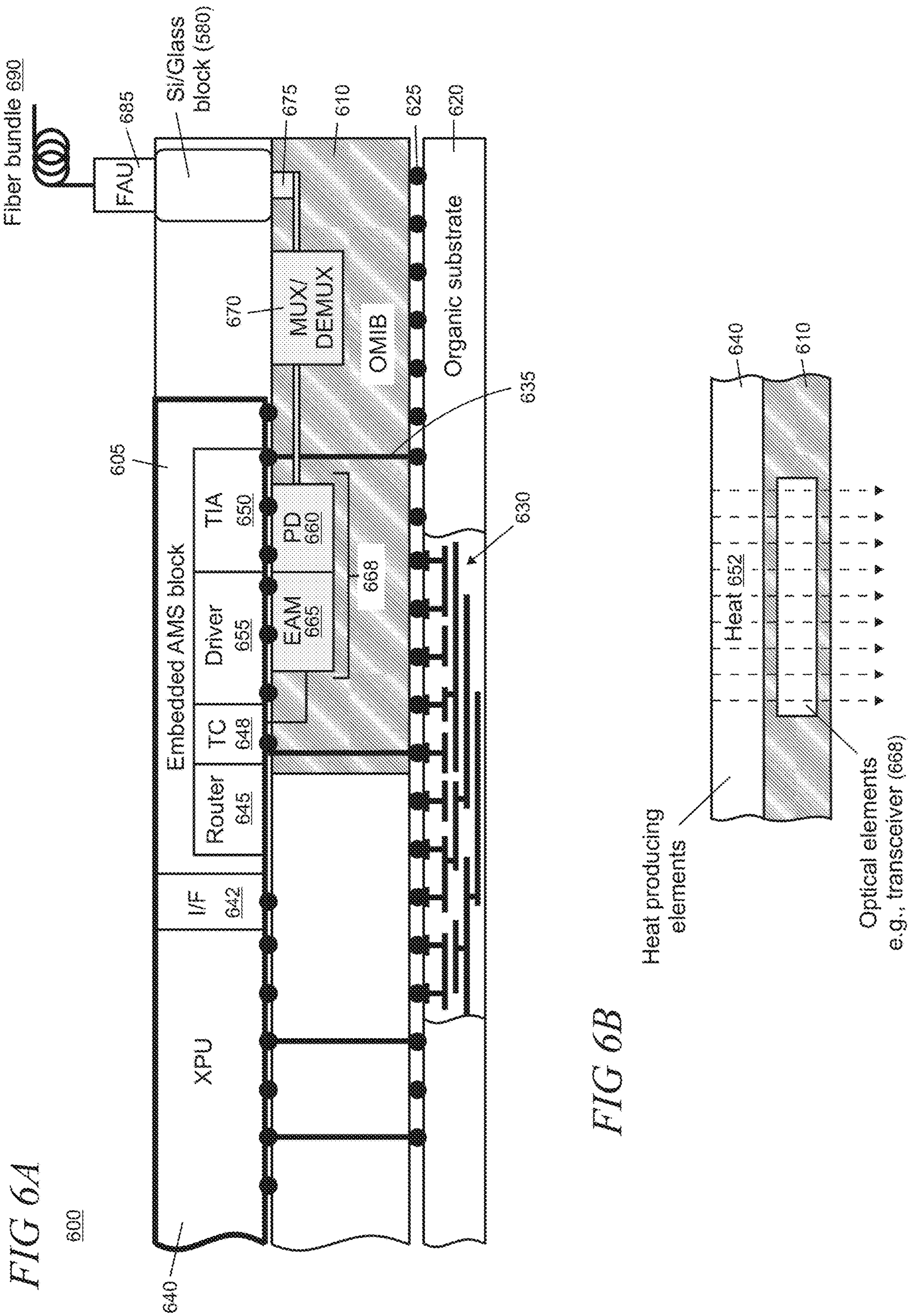
FIG. 6A is an elevation view of a portion of an illustrative OMIB SiP that includes an embedded analog/mixed signal (AMS) block.
FIG. 6B illustratively shows heat flow from EICs to a PIC in an OMIB SiP.

FIG. 6A is an elevation view of a portion of an illustrative OMIB SiP 600 that provides an alternative to the architecture shown in FIG. 5 and described above that uses a discrete EIC. In the OMIB SiP 600, an analog/mixed signal (AMS) block 605 is embedded as a part of the die with the XPU 640. The XPU compute part and AMS block part in the die communicate via a suitably configured interface (I/F) 645. As shown, the AMS block includes a TIA 650 and modulator driver 655 that interoperate with corresponding photodetector 660 and EAM 665 that implement a transceiver 668. The AMS block may include SerDes elements (not shown) in some implementations. Other elements in the OMIB SiP 600 are similar to those in the OMIB SiP 500 in FIG. 5 and operate in the same way as their counterparts, as previously discussed.

The elements include an organic substrate 620 on which an OMIB 610 is coupled via electrical interconnects 625. A router 645 is provided and a TC block 648 is optionally utilized. The OMIB includes a multiplexer/demultiplexer 670 and grating coupler 675. The grating coupler interfaces with an optically transparent Si or glass block 680 (or a block comprising a combination of Si and glass) which is coupled to an FAU 685 and fiber bundle 690 to support off-package communications with external systems and devices such as light engines.

In the stacked architectures shown in FIGS. 5 and 6A, each of the transceivers, each comprising the PD and EAM, is located directly beneath the heat-producing components of the ICs such as the XPU. The electrical and optical components are typically spaced apart with a relatively small gap. As shown in FIG. 6B, the heat 652 produced by XPU 640 and/or other EICs in the SiP, often radiates into the OMIB 610 to thereby impact the operating environment of optical components such as the transceiver 668. In accordance with the present principles, the EAM disclosed herein (e.g., elements 565 and 665) are specifically designed with respect to the expected thermal behavior of EICs.

An EAM is a semiconductor-based optical modulator that is used for controlling a light source using voltage. For example, an EAM uses low voltage amounts to modulate a laser beam. EAMs may utilize the Franz-Keldysh effect for electrically-induced changes in optical absorption. By way of context, heat-producing electronic elements in the XPU exhibit a wide variation in the amount of heat they produce under different loads. Optical modulation elements in the OMIB are designed to operate in a defined temperature range.

The impact of widely varying heat from the electronic elements being directly coupled to optical modulation elements makes it an important consideration when designing optical components in the OMIB that meet required operating parameters and are reliable in these conditions. This becomes even more important in a photonic fabric environment, where thousands of electronic elements are next to corresponding optical modulation elements (e.g., within 50 microns). While there is a large advantage to the speed of computations and energy efficiency that comes from implementing a direct coupling between electronic elements and optical modulation elements, the impact of varying levels of heat on the OMIB can also be a disadvantage. Indeed, a photonic fabric is designed to have optical modulation elements that can operate efficiently in a temperature range that is consistent with what it will experience when the XPU is operating at or near the max load. Likewise, when operating at a smaller load, the amount of heat produced by the XPU that impacts OMIB will be smaller and the temperature is lower in the region where the optical modulation elements are operating. Accordingly, it is important to have optical modulation elements that are also efficient within these lower-temperature conditions.

The material and type of optical modulator used takes into account the expected temperature conditions in the OMIB. Consideration is also given for the temperature fluctuations that indirectly result from an idling XPU as well as for other characteristics of a system that could cause changes to the thermal operating environment of the optical modulation elements. Accordingly, the EAM described herein accounts for these factors and efficiently operates across a wide age of operations.

In various embodiments, to achieve a stable operation over a wide temperature range, the EAM is made of bulk semiconductor material. For example, the EAMs are made of one or more materials, such as pure Germanium or Silicon (or their alloys), or various so-called III-V materials, which primarily include indium phosphide (InP) or gallium arsenide (GaAs) material systems.

One use case for employing thermally-stable optical modulation elements is to accommodate operations over a wide temperature range, as discussed previously. Another use case includes situations involving high optical modulation amplitude (OMA) output, which is typical in narrower operating ranges while still being thermally stable. Optical modulation elements that are designed for operation over a wide temperature range typically operate in a range that exceeds 30 degrees Celsius (although an optical modulation element with a narrower operating range is also feasible). Optical modulation elements that are designed for high OMA output typically operate in a range that is smaller than 30 degrees Celsius (although an optical modulation element with a broader operating range is also feasible).

This disclosure describes EAMs that operate over a wide temperature range. In some embodiments, the EAMs are based on quantum-confinement architectures and achieve enhanced performance in terms of higher OMA output from the EAMs over a narrower temperature range. For example, an EAM that is based on the quantum confined stark effect (QCSE) achieves these results, especially when made for bulk semiconductor materials (e.g., alloys of Germanium and Silicon as well as alloys using III-V materials based on the Indium Phosphide and Gallium Arsenide systems).

In some embodiments, the thermally-stable optical modulator operates in a temperature range larger than 30 degrees Celsius. For example, the thermally-stable optical modulator is an EAM that is about 50 microns in size and operates at data rates between 50-115 Gbps, at less than 1.0 volt of power. In these embodiments, the EAM enables silicon photonics packaging directly to the processor, XPU, and HBM memory chips. Additionally, the EAM provides optical connectivity both within a chip as well as chip-to-chip. Additionally, one or more embodiments, the EAM (i.e., the thermally-stable optical modulator) has stable operations while also having a narrow (or fairly narrow) operating range, which may be further enhanced by a thermal control loop.

In various embodiments, the EAM (i.e., the thermally-stable optical modulator) operates in a temperature range smaller than 30 degrees Celsius. For example, the EAM is based on quantum-confinement architectures, as described. In these instances, a higher optical OMA output from the EAM is used over a narrower temperature range (e.g., less than 30 degrees Celsius) to achieve enhanced performance. Additionally, as noted above, in some of these embodiments, the EAM is made from (e.g., consist of) materials selected from germanium, silicon, an alloy of germanium, an alloy of silicon, an III-V material based on InP, and/or an III-V material based on GaAs.

As also noted above, in certain embodiments, the EAM (i.e., the thermally-stable optical modulator) uses a quantum confined stark effect (QCSE) for an electrically-induced change in optical absorption. In this way, the EAM outputs a higher optical modulation amplitude. For example, the EAM utilizes a QCSE modulator with a high OMA to achieve a wide or fairly wide operating range, which may be further enhanced by the thermal control block.

Figure 7:
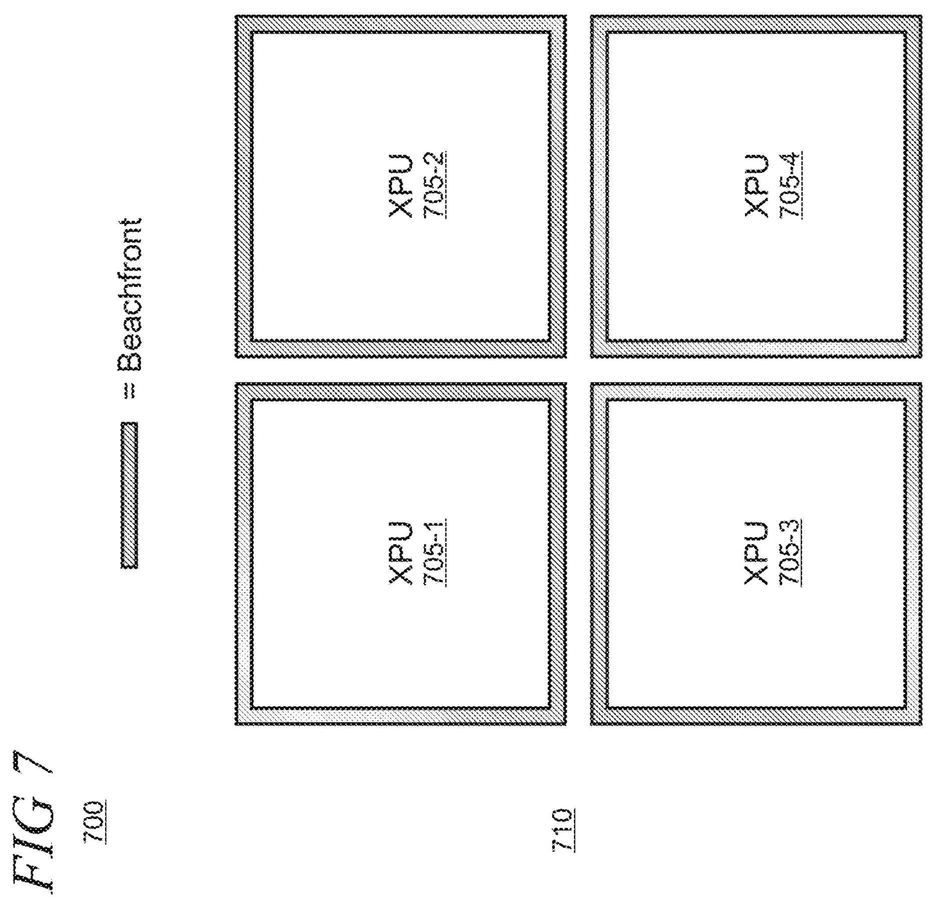
FIG. 7 is a plan view of a portion of a first illustrative embodiment of an OMIB SiP that includes four XPU dies.

FIG. 7 is a plan view of a portion of a first illustrative embodiment of an OMIB SiP 700 that includes four XPU dies 705-1, 705-2, 705-3, and 705-4 arranged in a planar 2×2 array 710. The beachfront of the XPUs is limited to the perimeter edges of the dies, as indicated by the shaded portions in the drawing. For high bandwidth with low latency, electrical chip-to-chip (eC2C) interconnects are placed at the beachfront using relatively short electrical pathways between edge-adjacent dies. Short electrical paths minimize signal latency and parasitic losses while improving communication reliability by lowering bit error rate (BER) through the minimization of noise, crosstalk, and attenuation. Thus, the availability of beachfront is a limiting factor for inter-die data transfer implemented with eC2C interconnects.

Figure 8:
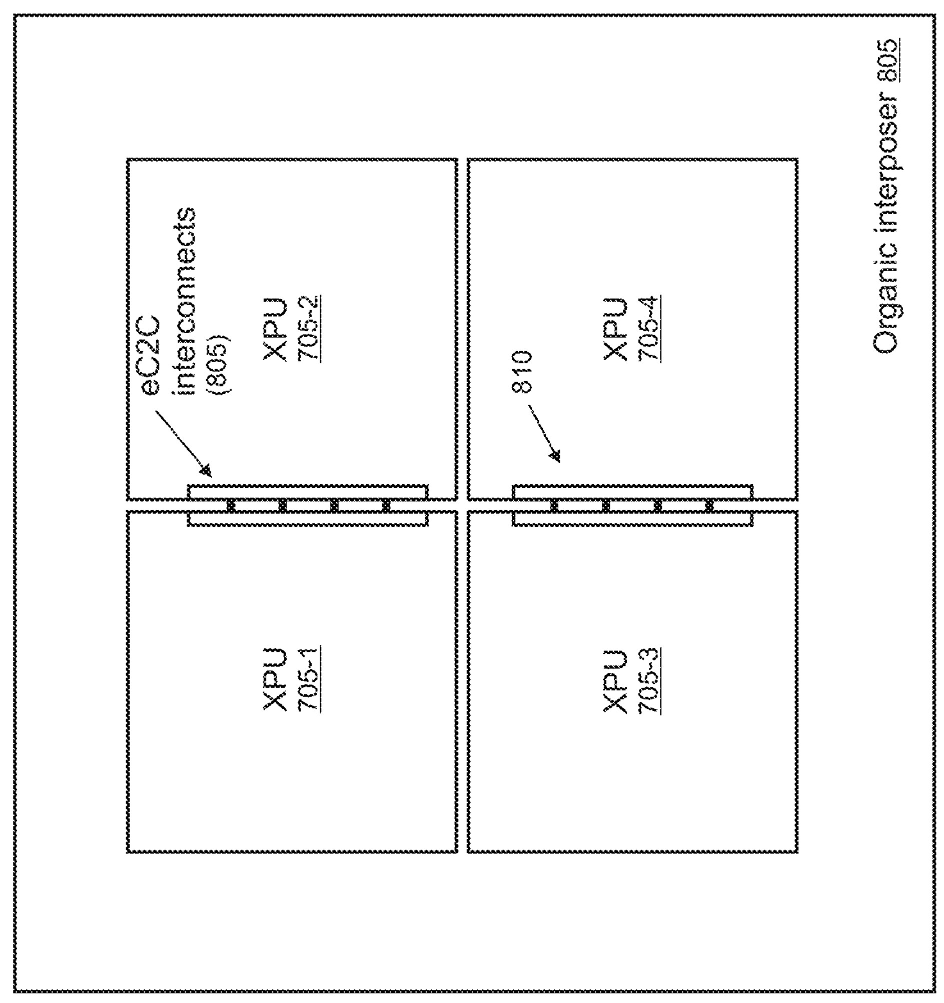
FIG. 8 is a plan view of a portion of an illustrative OMIB SiP that includes four XPU dies that are disposed on an organic interposer in which horizontally adjacent dies are electrically coupled via eC2C (electrical chip-to-chip) interconnects on the beachfronts of the respective dies.
Figure 9:
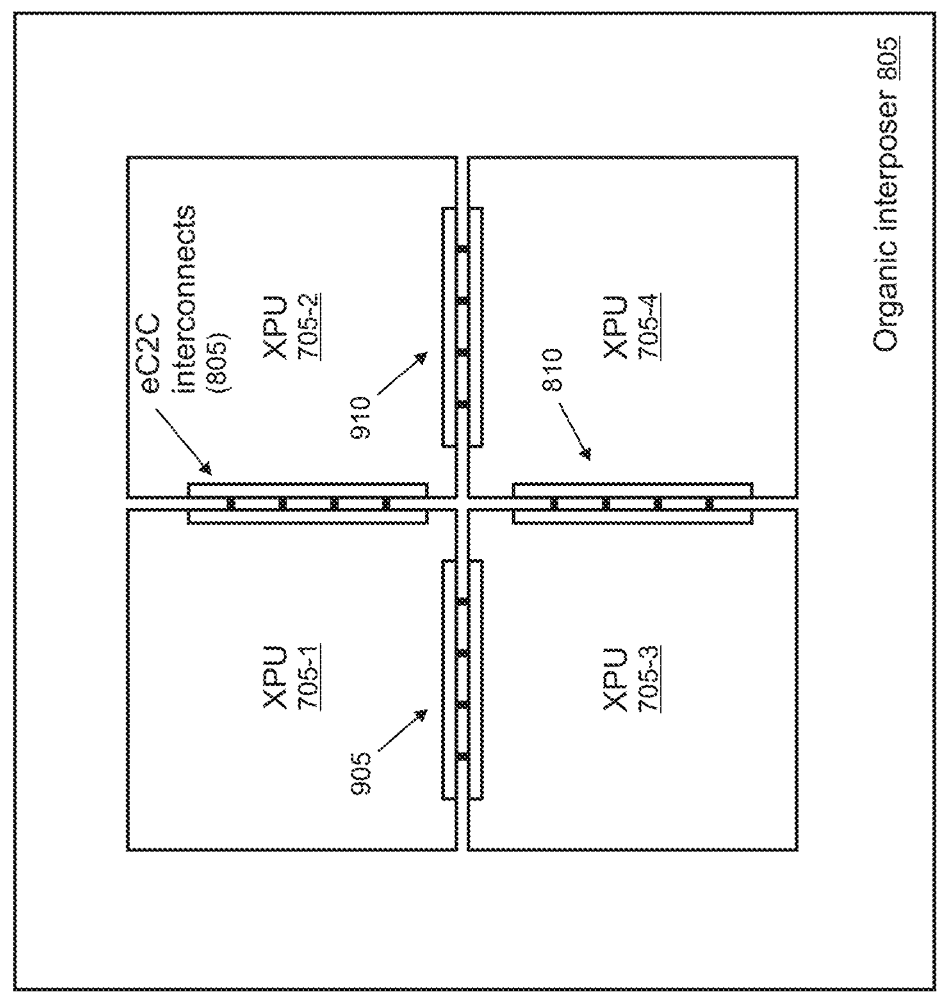
FIG. 9 is a plan view of a portion of an illustrative OMIB SiP that includes four XPU dies in which vertically adjacent dies are further electrically coupled via eC2C interconnects on the beachfronts of the respective dies.

FIG. 8 is a plan view of a portion of the OMIB SiP 700 in which the XPU dies 705-1, 705-2, 705-3, and 705-4 are disposed on an organic interposer 805. As shown, horizontally edge-adjacent dies in the 2×2 array, XPUs 705-1 and 705-2, are electrically coupled via eC2C interconnects 810 and 815 located at the beachfronts of the respective dies. FIG. 9 is a plan view of a portion of an alternative implementation for the OMIB SiP 700 in which vertically edge-adjacent dies, XPUs 705-3 and 705-4, are further electrically coupled via eC2C interconnects 905 and 910 at the beachfronts of the respective dies.

The limitations on beachfront availability with the XPU dies, in combination with the requirement to minimize the length of electrical pathways, results in difficulties in establishing effective die-to-die communications among dies that are not edge-adjacent. In the 2×2 array shown, high bandwidth low latency communications may be realized between horizontal and vertical pairs of dies, while not be readily achieved between dies that are corner adjacent. For example, diagonal electrical paths between XPU 705-1 and 705-4 are not implementable because of the lack of adjacent beachfront of the edges of these dies and the distances are too large for the electrical signals to effectively traverse.

Figure 10:
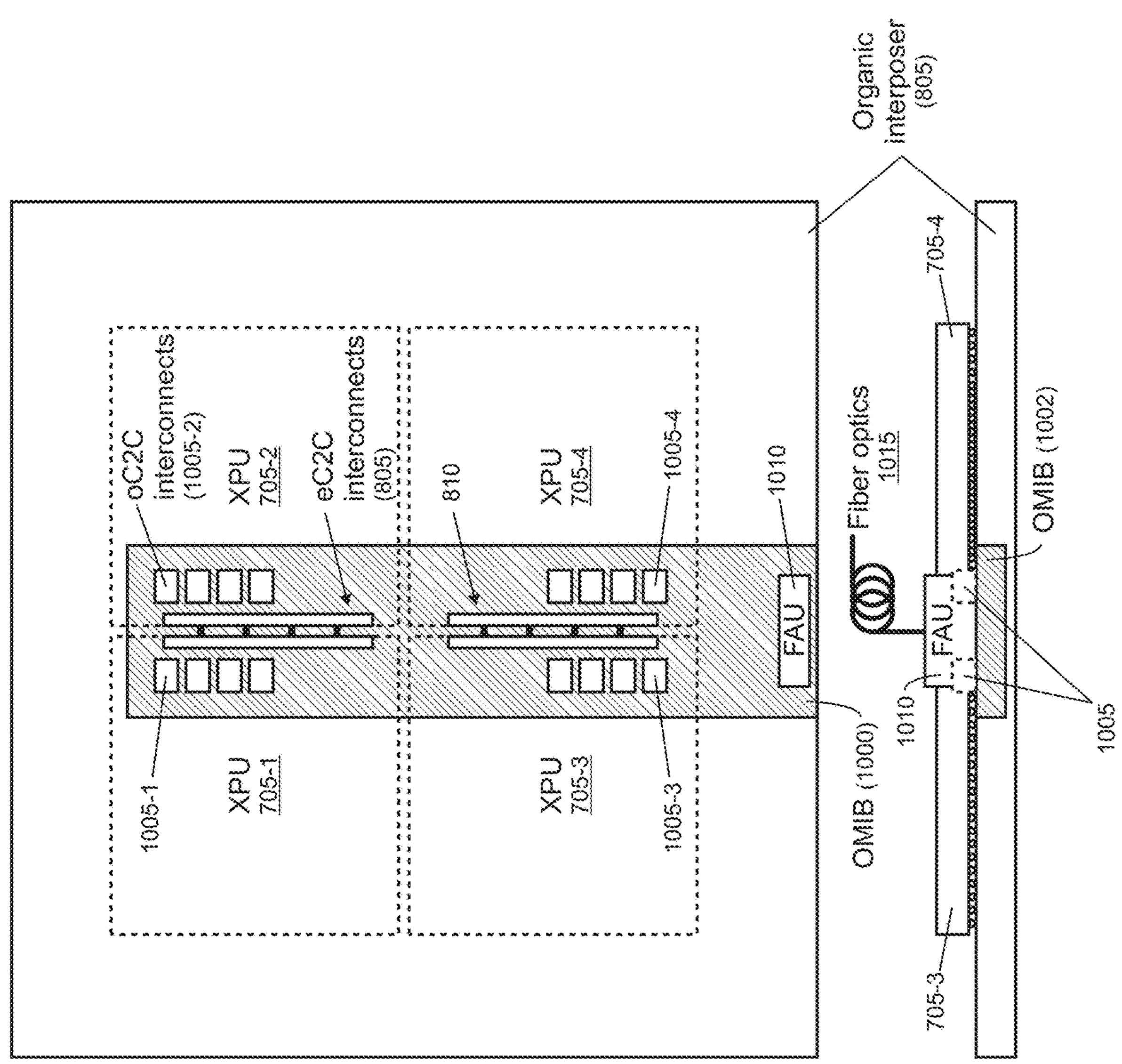
FIG. 10 shows plan and elevation views of a portion of an illustrative OMIB SiP in which an OMIB provides oC2C (optical chip-to-chip) interconnects to the dies away from the beachfronts without interfering with the eC2C interconnects.

The beachfront limitations of the XPU dies discussed above are overcome by utilization of an OMIB arranged in accordance with the present principles. FIG. 10 shows plan and elevation views of a portion of the OMIB SiP 700 in which an OMIB 1002 uses oC2C (optical chip-to-chip interconnects) providing optical communication interfaces between the OMIB and each of the four XPU dies 705-1, 705-2, 705-3, and 705-4 to thereby enable optical inter-die communications. The OMIB 1002 is configurable in a similar manner to OMIB 610 (FIG. 6A), as described above, where it located directly below portions of the XPU dies in a SiP that includes an organic interposer 805. An FAU 1010 is utilized which is optically coupled to a Si/glass block and grating coupler (not shown) disposed on the OMIB to enable off-package communications via fiber optics 1015 to other systems and/or devices.

The oC2C interconnects, 1005-1, 1005-2, 1005-3, and 1005-4, are positioned away from the beachfronts of the XPU dies 705 and do not interfere with the eC2C interconnects 805 and 810. The oC2C interconnects are typically configured to enable connectivity between pairs of transceivers in the OMIB 1002 to support bidirectional communication paths between the XPUs. The positioning of the oC2C interconnects on the OMIB with respect to the interior portions (i.e., portions away from the beachfront) of the XPU dies is facilitated by the OMIB embodiments disclosed herein.

The present OMIB SiP architectural designs utilize temperature-stable optical modulators in the form of EAMs, as described above, that are designed to be tolerant of the high-heat environment that is created by the close physical coupling between the EICs and PICs (e.g., XPUs and OMIBs) that is driven by the AI infrastructure design requirements of high bandwidth, low latency, and high power-efficiency. The tight proximity helps to overcome the limitations on the XPU beachfront by enabling SerDes electrical signals to directly drive the photonic elements over very short distances. In some implementations, the distances are in the range of tens of microns which significantly improves bandwidth while reducing the expenditure of energy per bit.

Figure 11:
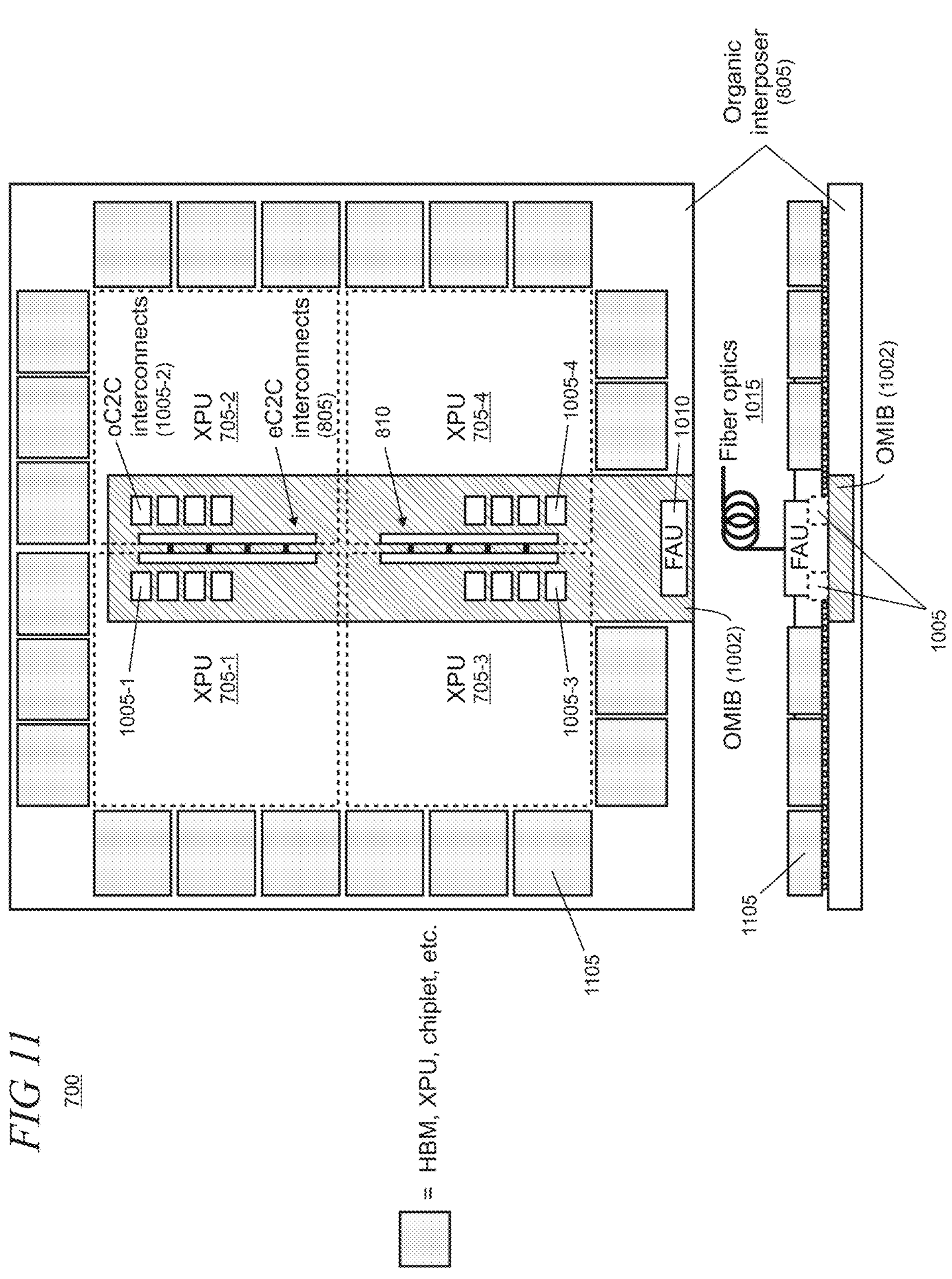
FIG. 11 shows plan and elevation views of a portion of an illustrative OMIB SiP in which high bandwidth memory (HBM) chips are coupled via electrical interconnects such as microbumps around the perimeter of an organic interposer in the SiP.

FIG. 11 shows plan and elevation views of a portion of the OMIB SiP 700 in which additional EICs such as high bandwidth memory (HBM) devices, XPUs, EICs, and/or chiplets (representatively indicated by reference numeral 1105) are coupled, via suitable electrical interconnects such as microbumps, around the perimeter of an organic interposer 805 in the SiP. Having HBM in the same package as the compute XPUs is typically advantageous for handling AI workloads which can often demand large parallel data movement between memory and compute.

Figure 12:
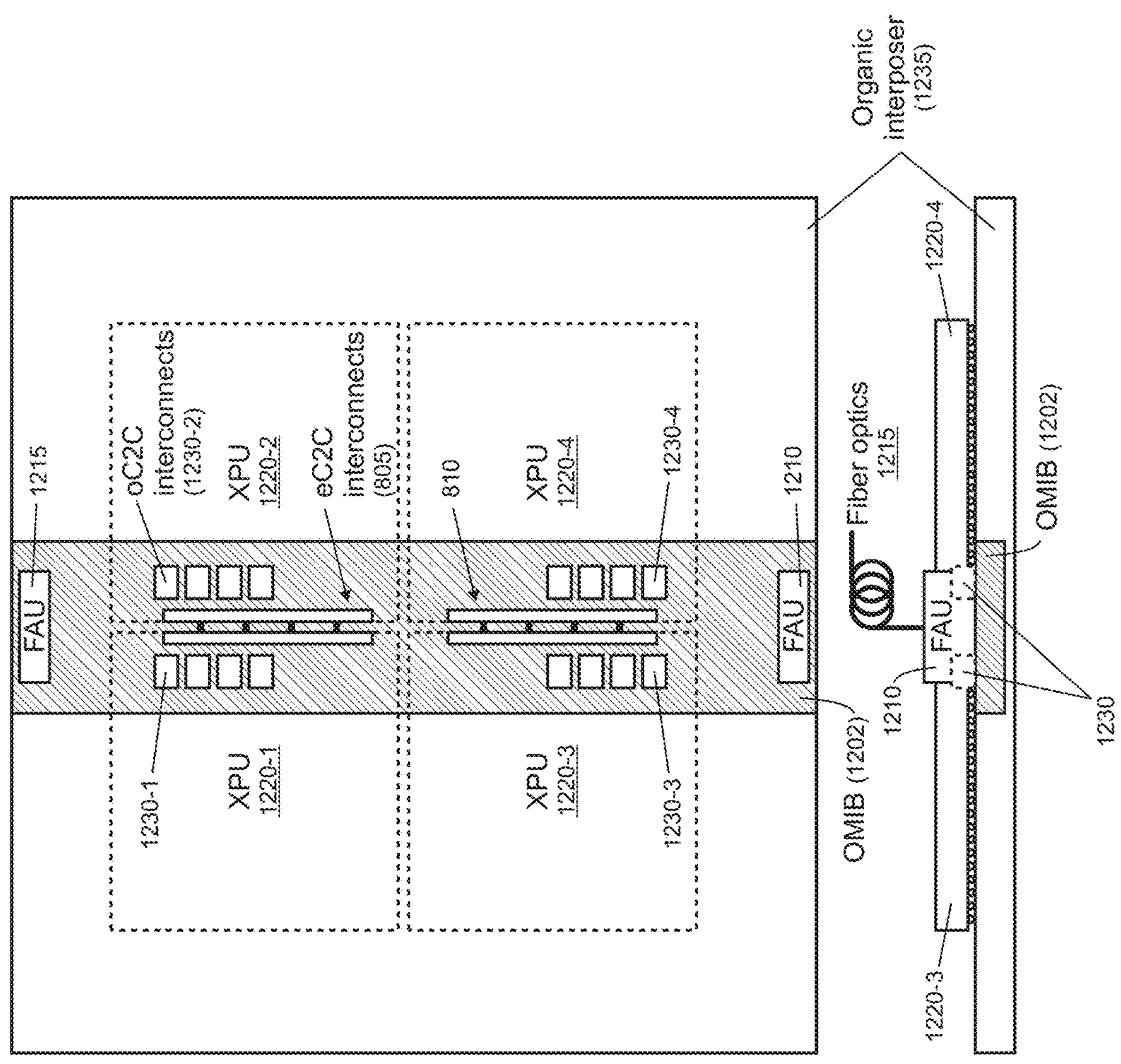
FIG. 12 shows plan and elevation views of a portion of an illustrative OMIB SiP in which an OMIB provides two fiber array unit (FAU) interfaces at respective opposite ends of the OMIB.

FIG. 12 shows plan and elevation views of a portion of an illustrative OMIB SiP 1200 using an alternative configuration in which an OMIB 1202 provides two fiber array unit (FAU) interfaces 1210 and 1215 at respective opposite ends of the OMIB 1202. The SiP includes four XPUs 1220 that are packaged with the OMIB using an organic interposer 1225.

A single OMIB SiP providing a multiplicity of FAUs may be beneficial in some applications where higher channel counts and increased bandwidth for off-package communications is required. Multiple FAUs can facilitate scalability and/or redundancy of off-package connectivity. In addition, deployment flexibility may be enhanced by multiple FAUs providing for diverse physical positioning in the package. Dedicated FAU resources can be allocated for particular XPUs or workloads in some implementations. As with the OMIB SiP 700 shown in FIGS. 10 and 11, the oC2C interconnects 1230 between the OMIB 1202 and XPUs 1220 are located away from the XPU beachfronts.

Figure 13:
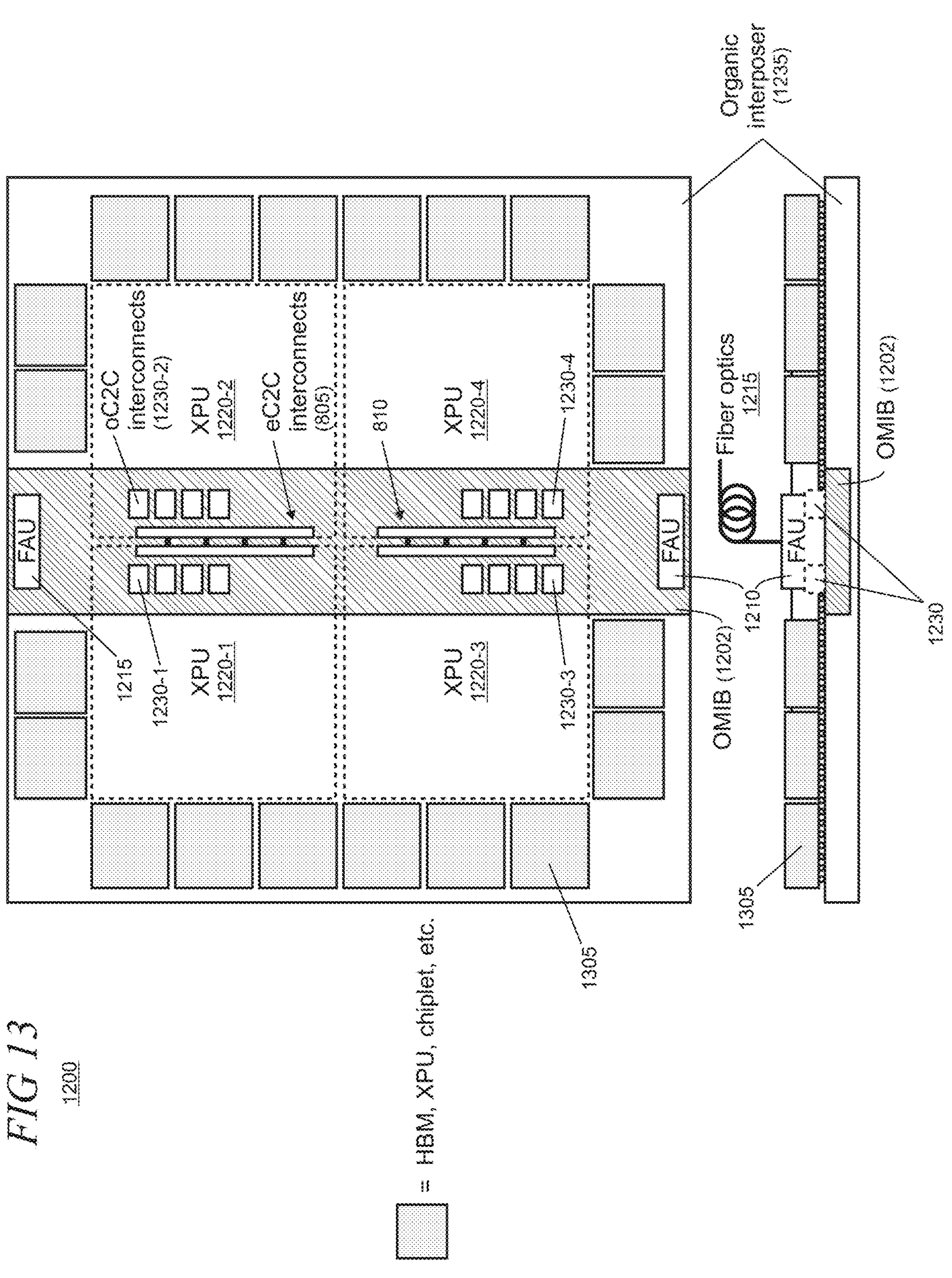
FIG. 13 shows plan and elevation views of a portion of an illustrative OMIB SiP with two FAU interfaces in which HBM chips are located around the perimeter of the organic interposer.

FIG. 13 shows plan and elevation views of a portion of the OMIB SiP 1200 in which additional EICs such as high bandwidth memory (HBM) devices, XPUs, EICs, and/or chiplets (representatively indicated by reference numeral 1305) are coupled, via suitable electrical interconnects such as microbumps, around the perimeter of an organic interposer 1235 in the SiP.

Figure 14:
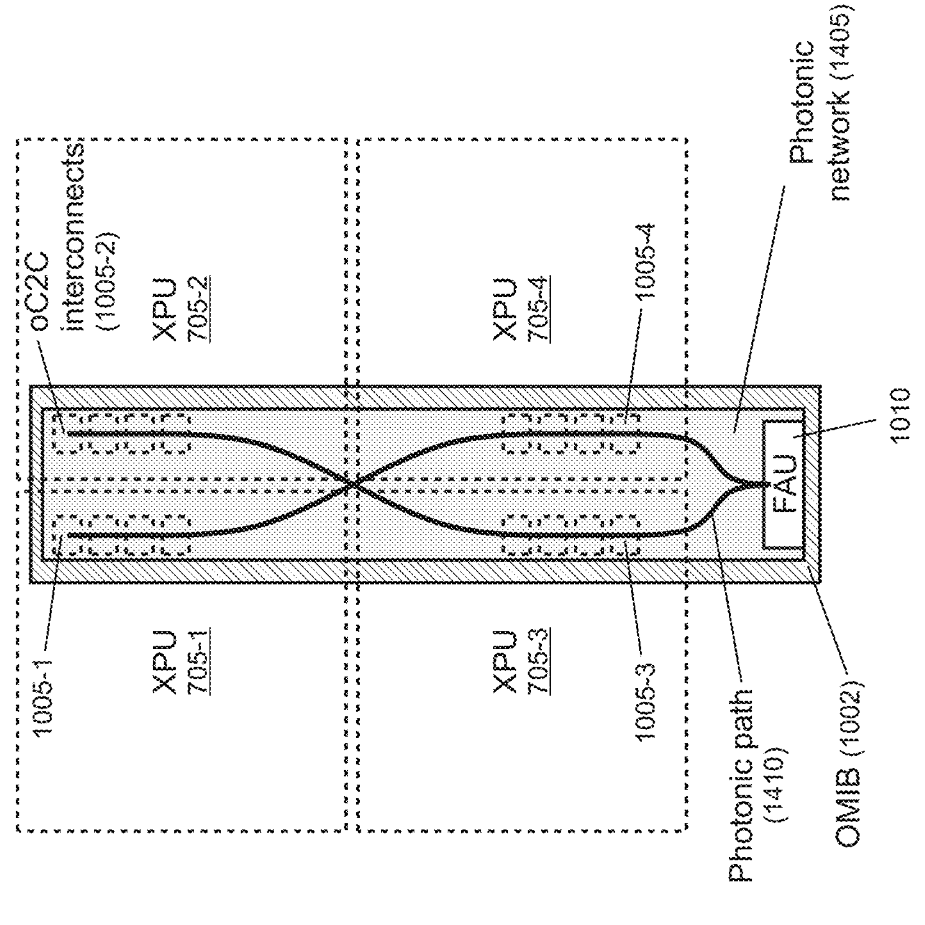
FIG. 14 is a plan view of a portion of an illustrative OMIB SiP with a single FAU interface showing exemplary paths in a photonic network that is optically coupled to the oC2C interconnects and the FAU interface.
Figure 15:
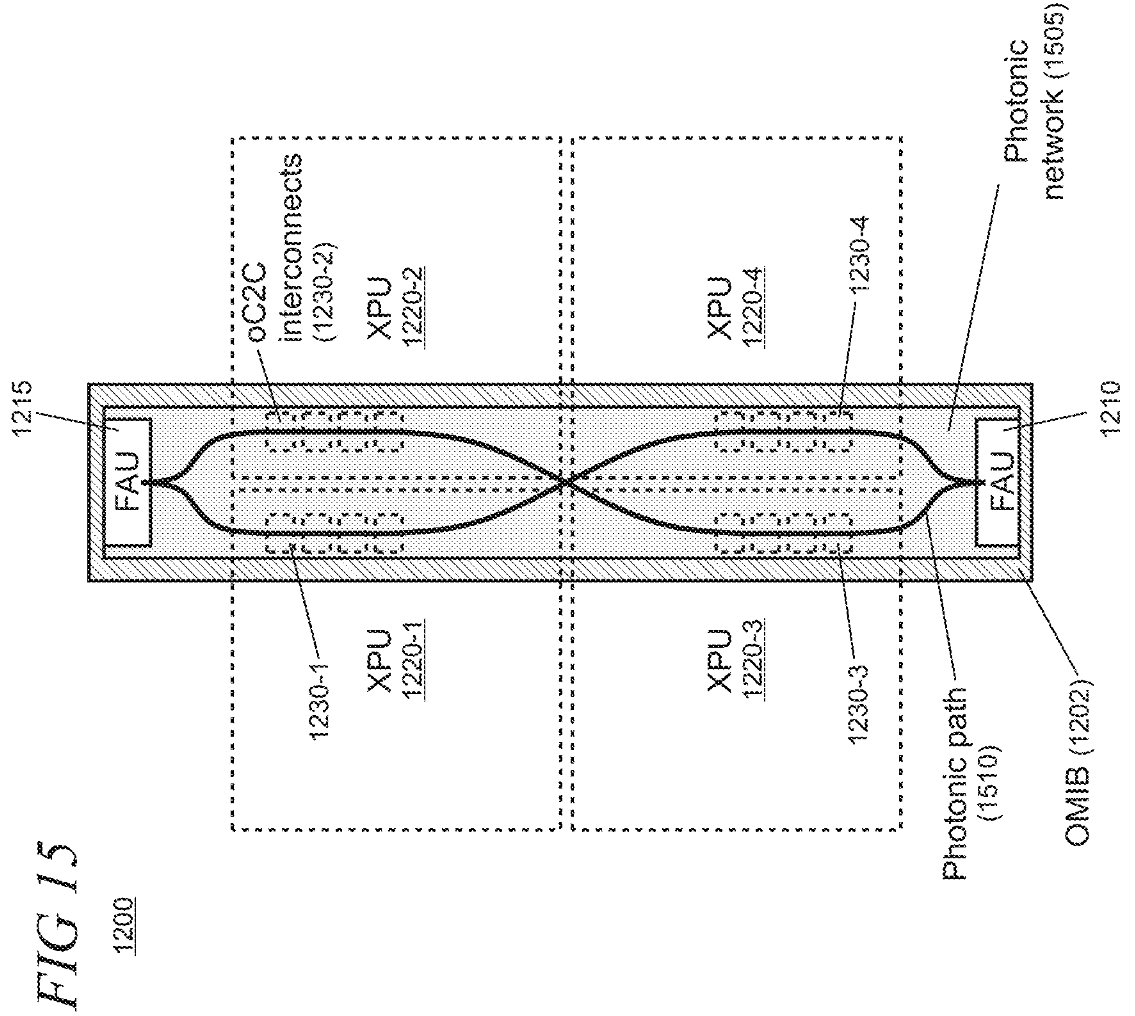
FIG. 15 is a plan view of a portion of an illustrative OMIB SiP with two FAU interfaces showing exemplary paths in a photonic network that is optically coupled to the oC2C interconnects and the FAU interfaces.

The OMIBs 1002 and 1202 respectively shown in FIGS. 10 and 12 include photonic networks within the OMIBs. FIG. 14 is a plan view of a portion of the OMIB SiP 700 with a single FAU interface 1010 showing exemplary photonic paths in a photonic network 1410. The photonic network is optically coupled to the oC2C interconnects 1005 in the XPUs 705 and the FAU interface via one or multiple photonic paths (representatively indicated by reference numeral 1410). FIG. 15 is a plan view of a portion of the OMIB SiP 1200 with two FAU interfaces 1210 and 1215 showing exemplary photonic paths in a photonic network 1510. The photonic network is optically coupled to the oC2C interconnects 1005 in the XPUs 705 and the FAU interfaces via one or multiple photonic paths (representatively indicated by reference numeral 1410).

As discussed above, optical communications, as implemented by the photonic networks in the OMIBs provides advantages over traditional electrical networks, particularly in the context of AI infrastructure. The photonic networks provide higher bandwidth and data rates with lower latency and improved signal integrity by having immunity to electrical interference with reduced crosstalk and signal degradation over distance. Optical interconnects require substantially less energy per bit transmitted because photons do not dissipate energy as heat like electrical currents in copper interconnects and signal paths.

The number of photonic paths in a photonic network in a given OMIB design, their distribution within an OMIB, and points of optical connection can vary by implementation and the requirements of a particular SiP application. The photonic paths are typically bidirectional between given points of connection to enable full duplex communications and can further leverage WDM technologies in some implementations to increase bandwidth and data rates for inter-die and optical communications with external devices and/or systems.

Figures 16, 17:
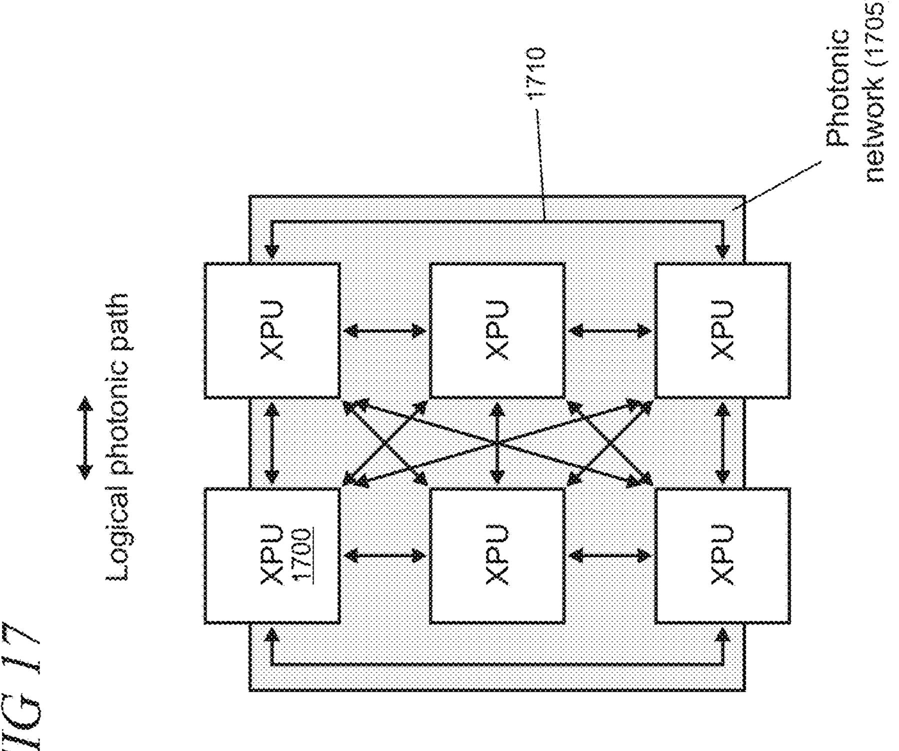
FIG. 16 shows illustrative bidirectional optical links in an exemplary 2×2 array of XPU dies.
FIG. 17 shows illustrative bidirectional optical links in an exemplary 2×3 array of XPU dies.

FIG. 16 shows illustrative bidirectional optical links in an exemplary 2×2 array of XPU dies. In the arrangement shown, each of the XPUs (representatively indicated by reference numeral 1600) is optically coupled via the photonic network 1605 to each of the other XPUs. The bidirectional photonic paths (representatively indicated by reference numeral 1610) support inter-die communications between both edge adjacent and corner adjacent XPUs. That is, bidirectional photonic paths are provided in the horizontal, vertical, and diagonal directions. It is noted that the photonic paths are depicted by arrows to illustrate the logical optical connectivity between XPU dies in a simplified conceptual form. In practice, the physical photonic paths within the bridge may be implemented using different routing topologies than those depicted.

FIG. 17 shows illustrative bidirectional optical links in an exemplary 2×3 array of XPU dies. In the arrangement shown, each of the XPUs (representatively indicated by reference numeral 1700) is optically coupled via the photonic network 1605 to each of the other XPUs. The bidirectional photonic paths (representatively indicated by reference numeral 1610) support inter-die communications between both edge adjacent and corner adjacent XPUs. That is, bidirectional photonic paths are provided in the horizontal, vertical, and diagonal directions. It may be appreciated that the optical connectivity supported by the photonic network in an OMIB is extensible to other arrangements of XPU where the number of dies and array configuration can vary from those shown in FIGS. 16 and 17 and described above. For example, a 2″ array of XPU dies is supportable by a suitably configured OMIB which will typically utilize a multi-reticle design.

The physical size (i.e., length and width) of the OMIB designs disclosed herein can necessitate a fabrication process that employs multiple photolithography exposures using multiples reticles. That is, in these illustrative embodiments, the physical size of the OMIBs exceeds the maximum exposure field of the lithography tool, thereby requiring multiple reticle exposures to cover the full PIC area. For example, the OMIBs in the SiPs 700 and 1200 respectively shown in FIGS. 10 and 12 are sized to bridge a 2×2 array of XPU dies. Such configuration requires utilization of two or three reticles in a stitched reticle OMIB design. Stitching refers to the precise alignment and abutting of the exposure fields from multiple reticles on a wafer, where patterns from discrete reticle images are lithographically replicated and stitched together to form the whole PIC. The boundary where the two reticle fields meet is called the reticle boundary or stitch boundary.

Figure 18:
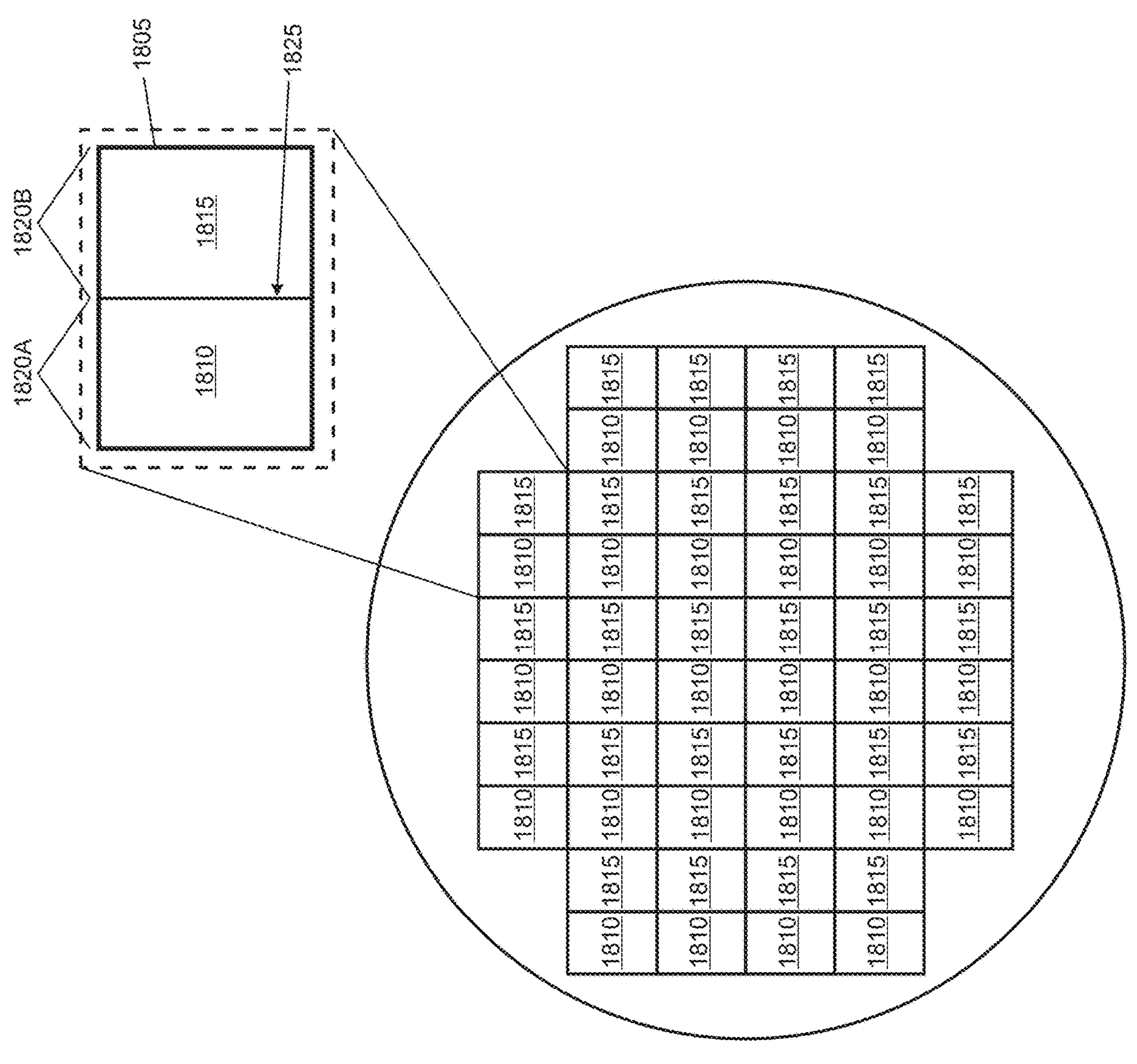
FIG. 18 is a plan view of an illustrative silicon wafer on which stitched reticle OMIB is patterned.

FIG. 18 is a plan view of an illustrative silicon wafer 1800 on which a reticle-stitched OMIB 1805 is patterned. The stitched reticle OMIB may be formed by patterning a first die area 1810 and a second die area 1815 on the silicon wafer. The first die area and the second die area are within respective reticle limits of a lithography system used to pattern the reticle-stitched OMIB on the silicon wafer. In particular, the first die area 1805 is within a first reticle limit 1820A and the second die area 1815 is within a second reticle limit 1820B. Although not explicitly shown, the reticle limits 1820A and 1820B may partially overlap one another around a boundary area 1825, as further discussed below.

In some cases, multiple reticles are utilized when a given layer's pattern in the PIC is larger than the lithography tool's exposure field which necessitates the pattern to be split among multiple reticles for stitching. However, the number of reticles utilized for a given OMIB design can be specified responsively to a variety of physical variables associated with the fabrication processes being utilized for the OMIB. These variables can include, for example and not by way of limitation: reticle size, OMIB size, layout, and shape, alignment and stitching precision, utilization of tiled designs, optical limitations of the lithography system utilized, and complexity of the routing used in the photonic network.

The number of individual masks in each mask set can vary according to specific OMIB design requirements and process steps that are utilized. Each mask corresponds to a single layer or process step for the OMIB. The use of complex PIC designs with multiple metal, via, and specialized layers will typically increase the total mask count.

Economic factors may also be considered when determining the number of reticles used. Reticle mask sets tend to be expensive, so reducing the number of unique reticles lowers overall mask costs. Simplifying masks, for example by removing layers or combining features, can reduce reticle count. Fabrication throughput is generally higher when fewer reticles are used during lithographic processing.

Symmetry of PIC features may also be a factor for determining how reticle fields are laid out, repeated, or mirrored across the OMIB pattern to optimize manufacturing. Mask symmetry considerations may effect how patterns are split and aligned during stitching to ensure optical continuity of photonic network elements (e.g., waveguides) while minimizing defects from mask edges and pattern distortions. By designing symmetrical mask patterns, repeated or mirrored portions of the OMIB can be patterned using the same reticle or a reduced set of reticles, thereby minimizing the total number required. This approach leverages pattern repetition to cover larger areas efficiently without needing a unique reticle for each OMIB segment in some cases.

Figure 20:
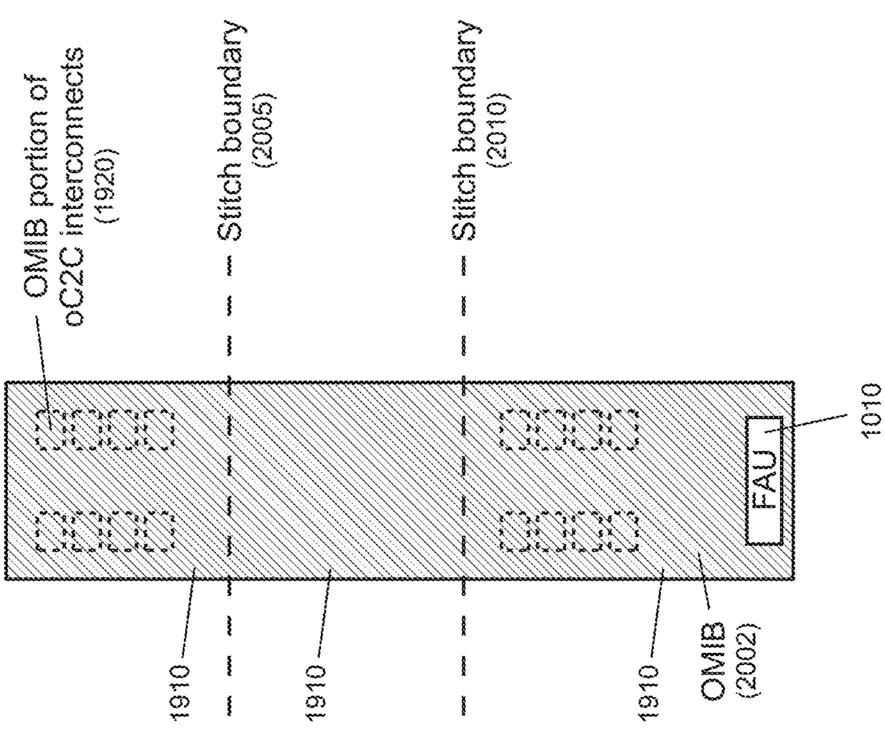
FIG. 20 is a plan view of an illustrative stitched reticle OMIB having two stitch boundaries.
Figure 19:
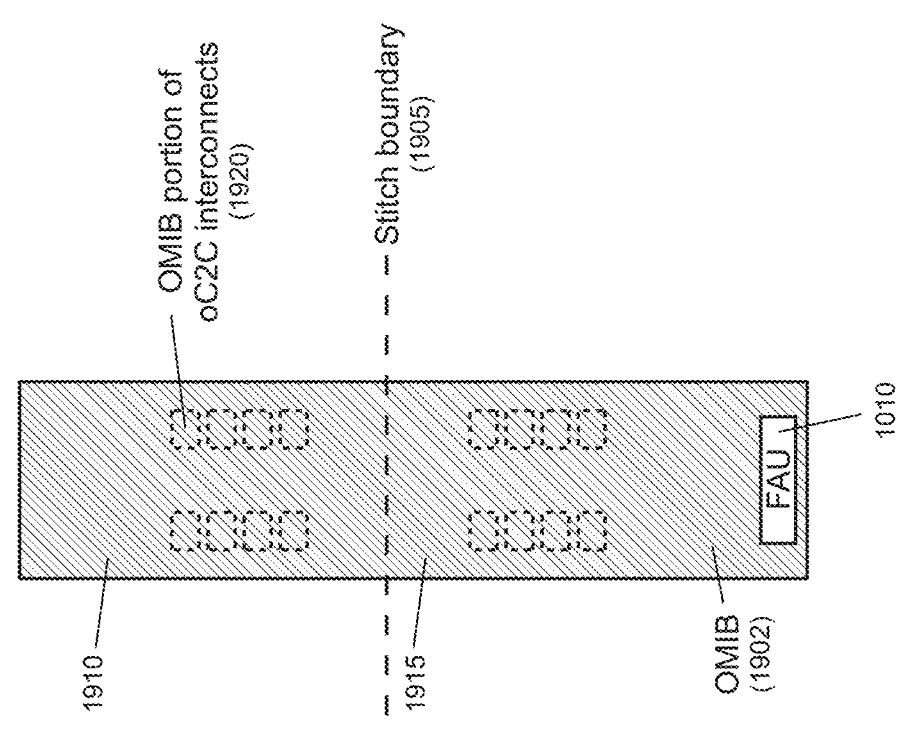
FIG. 19 is a plan view of an illustrative stitched reticle OMIB having a single stitch boundary.

FIG. 19 shows a plan view of an illustrative stitched reticle OMIB 1902 that spans two adjacent reticles having a single stitch boundary 1905. FIG. 20 is a plan view of a stitched reticle OMIB 2002 spanning three reticle fields having a two stitch boundaries 2005 and 2010 between the OMIB segments 2010, 2015, and 2018. The locations of the stitch boundaries, and the number of reticles and stitch boundaries utilized in a given OMIB design, may typically be determined by considering the fabrication process variables noted above. For example, it may be observed that the segments 1910 and 1915 of the OMIB 1002 in FIG. 19 have OMIB portions of the oC2C interconnects (representatively indicated by reference numeral 1920) that are closer together compared to those elements 2020 in OMIB 1002 in FIG. 20. Thus, in these particular illustrative examples, OMIB 1902 in FIG. 19 is a 2-reticle PIC design and OMIB 2002 in FIG. 20 is 3-reticle PIC design.

Figure 21:
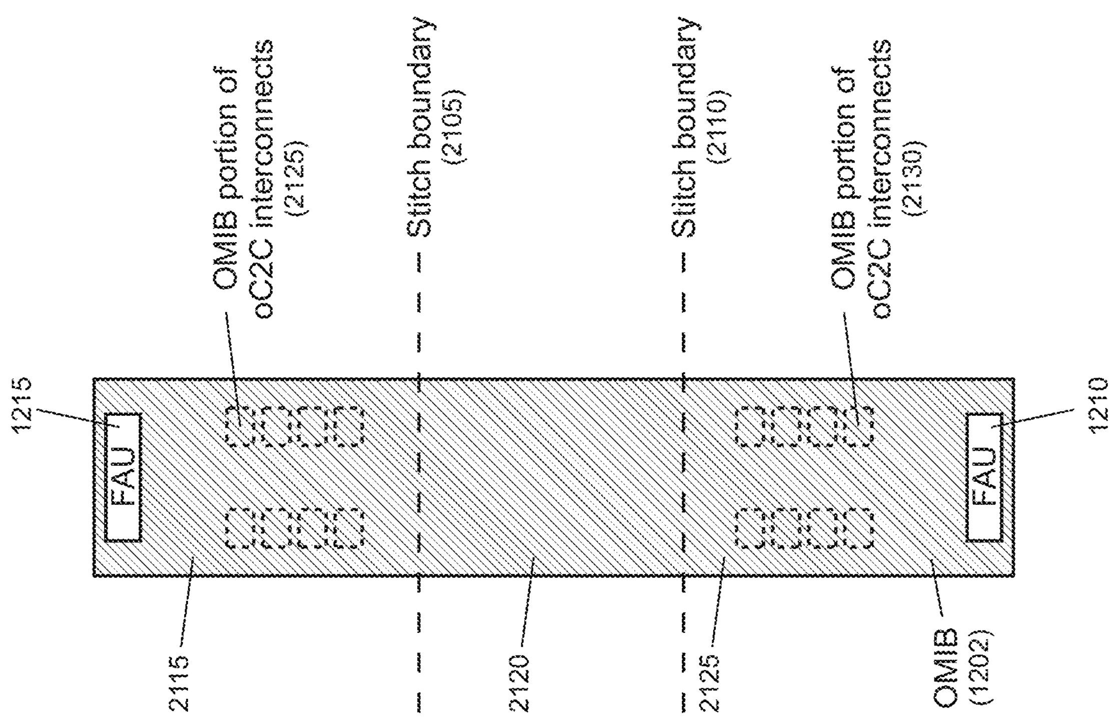
FIG. 21 is a plan view of an illustrative stitched reticle OMIB with dual FAU interfaces having two stitch boundaries.

FIG. 21 is a plan view of an illustrative stitched reticle OMIB 1202 with two FAU interfaces 1210 and 1215 having two stitch boundaries 2105 and 2110 among three OMIB segments 2115, 2120, and 2125. Three mask sets (not shown) are required to fabricate the OMIB. One pair of masks (e.g., mask sets 1 and 2) is utilized for the stitch boundary 2105 and another pair (e.g., mask sets 2 and 3) is utilized for the stitch boundary 2110.

In this illustrative example, end segments 2115 and 2120 of the OMIB 1202 include the OMIB portions of the oC2C interconnects 2125 and 2130 and photonic transceivers (not shown). The central segment 2120 does not include interconnect features and primarily includes optical features supporting the photonic network in the OMIB such as waveguides. The number of masks in the set for the reticle for the central segment 2120 can typically be reduced compared with the reticles of the end segments. For example, the waveguide segment of the OMIB may only require basic layers such as core waveguide patterning, cladding, and related structures. Some specialized masks for certain waveguide features such as tapered sections may be included in the mask set, depending on the design of the photonic network in the OMIB.

Some non-tiled features in the center that are not related to optics, such as implants, can typically be removed from the center mask set. Tiled layers in the center reticle cannot be removed, however, as additive layers, such as metallization for germanium features in the transceivers, are included for planarization and process uniformity. The waveguide segment of the OMIB will include dummy metal layers to ensure consistent topography across the wafer during processing. For example, when utilizing chemical mechanical planarization (CMP) without dummy metal in the center, the varying density of the OMIB between the metal-rich end segments and the metal-free center would cause uneven polishing rates.

FIGS. 22 and 23 show illustrative approaches to waveguide stitching that may be used to implement optical connections at the stitch boundaries in the stitched reticle OMIBs discussed above, in accordance with the present principles. The optical connections are implemented using stitches to enable efficient routing of optical signals among OMIB segments in stitch-boundary-crossing waveguides (i.e., each boundary-crossing waveguide includes an optical connection at the stitch boundary). In some implementations of the present principles, the optical connections can be wider than the waveguides away from the stitch boundaries. It is noted that the features shown are exaggerated for illustration purposes. Waveguide stitching refers to the method of aligning and joining waveguide structures precisely at the boundaries where the reticles meet, ensuring optical continuity between OMIB segments patterned in separate lithographic exposures. Reticle fields are stitched during the lithographic process such that the end of a waveguide in one exposure field aligns with and continues into the next. Rather than developing new, larger lithography tools, stitching offers a practical solution to fabricate high-density, large-area PICs using existing photolithography infrastructure and methodologies. In alternative implementations, to supplement or replace optical stitching at the manufacturing stage, photonic circuit portions can be aligned during the packaging stage such that the wider portions of waveguides are aligned at the boundaries between OMIB segments.

FIG. 22 shows an illustrative approach to waveguide reticle stitching using an abrupt stitch 2200. As shown, two illustrative masks 2205 and 2210 for respective layers of waveguides A and B, 2215 and 2220, are provided. The masks are overlapped as indicated by reference numeral 2225. In an abrupt stitch, the waveguide simply continues across the reticle boundary with minimal overlap, and the sidewalls of the waveguide change suddenly at the stitch interface. Any lateral misalignment between reticles appears as a discrete step or offset in the waveguide sidewalls at the boundary. This abrupt discontinuity can introduce mode mismatch, scattering, and elevated optical loss. The loss is proportional to the mask delta 2230.

To reduce sensitivities to discontinuities, tapers from the narrow to wider portions of the waveguides are implemented. The stitch length is dominated by the taper length and can be long if linear tapers are utilized. However, higher order, non-linear tapers can be utilized to reduce the stitch length in some cases.

FIG. 23 shows an illustrative approach to waveguide reticle stitching using an angled stitch 2300. In an angled stitch, the waveguide A and B, 2315, and 2320, widen and transition smoothly (adiabatically) across a deliberate overlap region 2325 between reticles. In this illustrative example, the waveguides are tapered all the way to the edges of the respective masks 2305 and 2310. The waveguides thus follow a relatively short, angled segment over the stitched area, rather than making a sudden transition.

Angled stitches minimize mode discontinuity and suppress optical loss because the transition is gradual. Loss is flat within a certain mask delta 2230 determined by taper width and can be an order of magnitude lower than with abrupt stitches, especially when the overlap (i.e., stitch length) is made sufficiently long and the widening is tailored to expected alignment tolerance. Stitch length is again dominated by taper length, but tapered waveguides can be narrower for angled stitches, resulting in smaller overall stitch length. However, the mask overlaps need to be quite large, since they need to roughly match the size of the tapers for the design to be effective.

Figure 24:
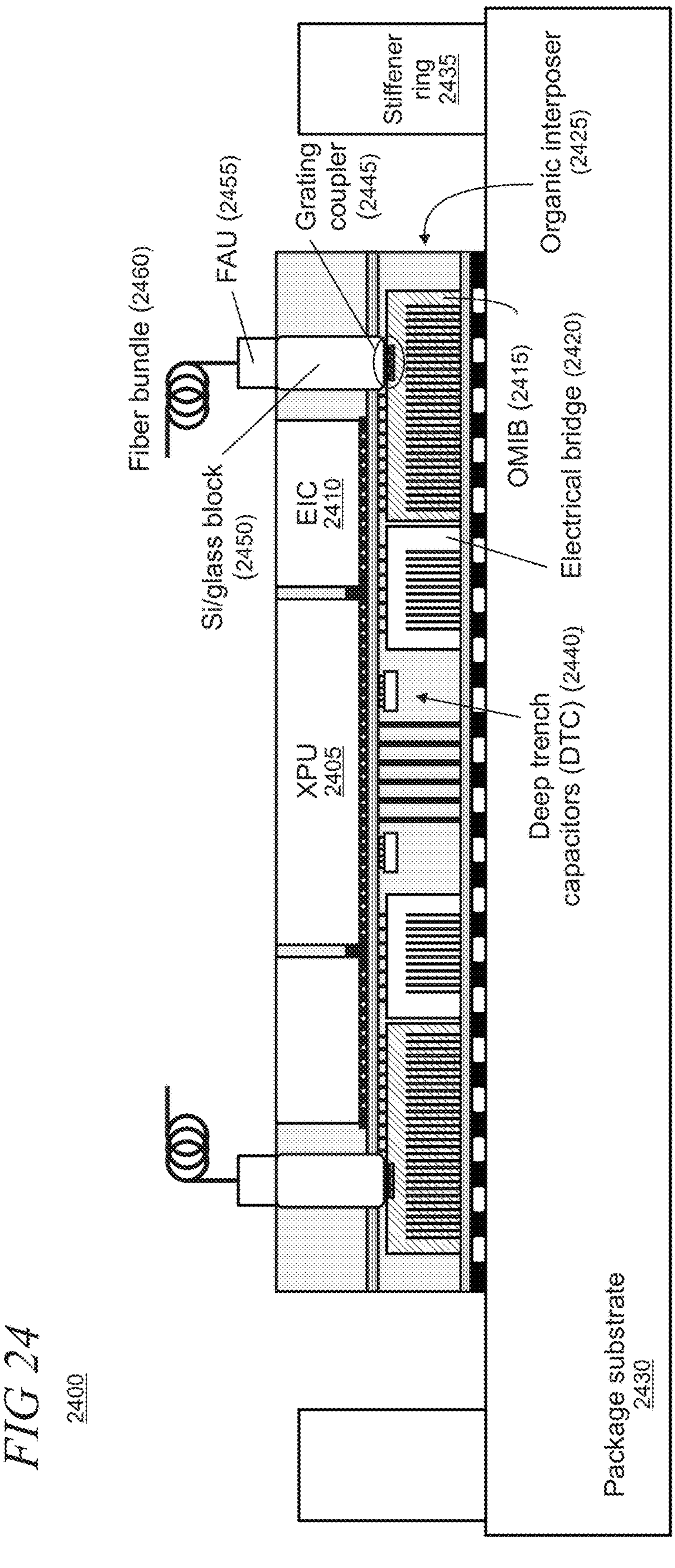
FIG. 24 is an elevation view of a second illustrative embodiment of an OMIB SiP having a single XPU die, six EICs, and six OMIBs with FAUs arranged on an organic interposer.
Figure 25:
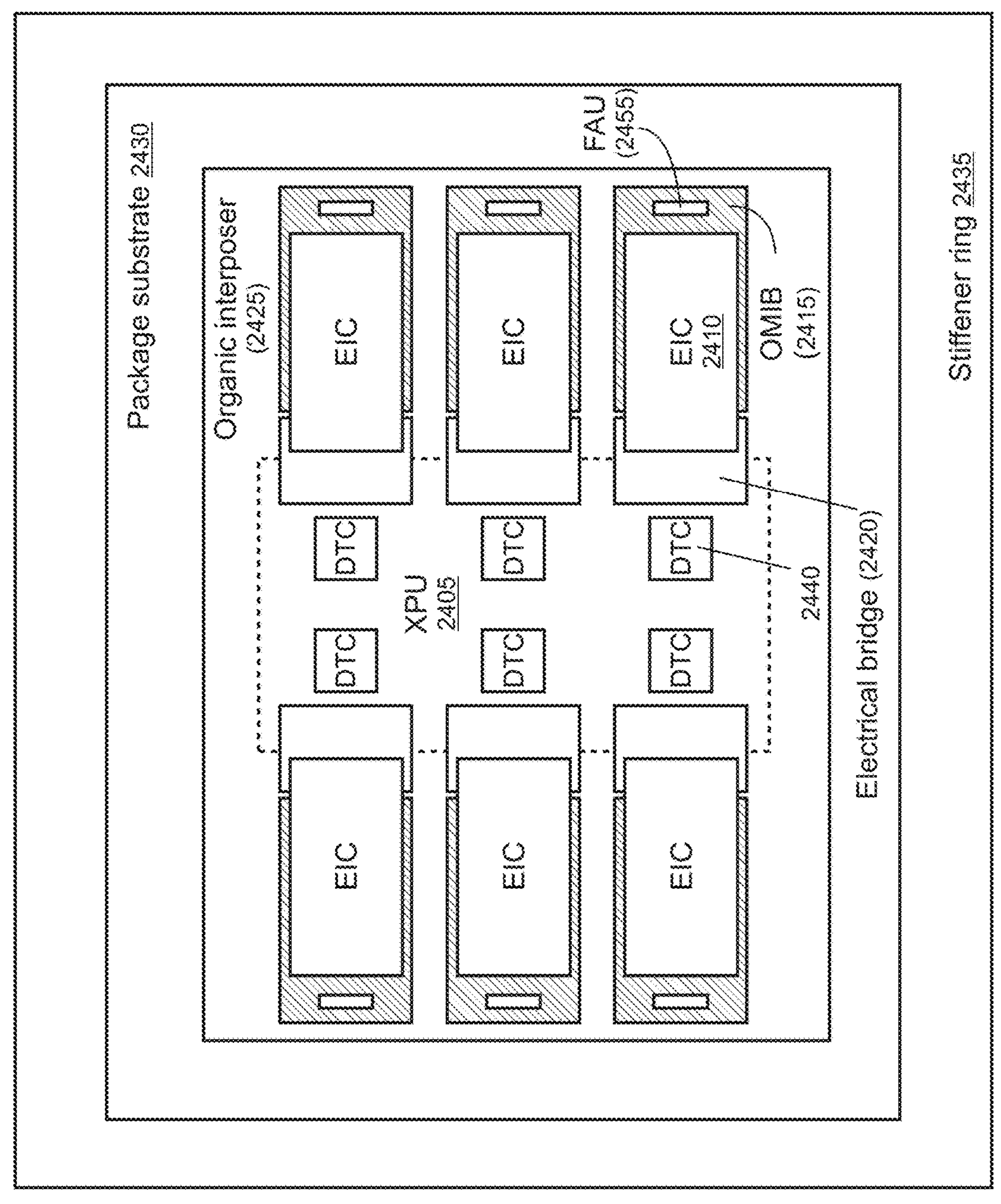
FIG. 25 is a plan view of a second illustrative embodiment of an OMIB SiP having a single XPU die, six EICs, and six OMIBs with FAUs arranged on an organic interposer.

FIG. 24 is an elevation view of a second illustrative embodiment of an OMIB SiP 2400 and FIG. 25 is a plan view. This embodiment has similar SiP architectural features of the OMIB SiP show in FIGS. 5 and 6A and described in the accompanying text. A single XPU die 2405 is provided in this second illustrative embodiment along with six EICs 2410 (e.g., chiplets) and six OMIBs 2415. However, it may be appreciated that the principles described herein can be extended to other architectures with differing XPU, EIC, and OMIB counts. Depending on the fabrication process variables discussed above, the OMIBs and/or organic interposer 2425 can be implemented as stitched reticle integrated circuits in some implementations.

The OMIBs 2415 are embedded with electrical bridges 2420 in an organic interposer 2425 and the XPU and EIC dies are located above the interposer in a stacked arrangement that is mounted on a package substrate 2430 having a stiffener ring 2435 around its perimeter. Embedded silicon capacitors 2440 (e.g., deep trench capacitors (DTC)) are provided in the interposer directly under the XPU die for power integrity by reducing power distribution network (PDN) impedance at the point of load. Reduced PDN impedance filters voltage fluctuations and supplies fast, stable current to the XPU during transient events, such as sudden changes in computational load, thereby improving operational stability and performance. Each OMIB 2415 includes a grating coupler 2445 that interfaces through a silicon and/or glass block 2450 to an FAU 2455 and fiber bundle 2460. The FAU and fiber bundles are connectable to an external light engine that provides optical signals for use by the photonic network for inter-package communications among the dies. The FAU and fiber bundles can also enable off-package communications with external devices and/or systems in some embodiments.

Figure 26:
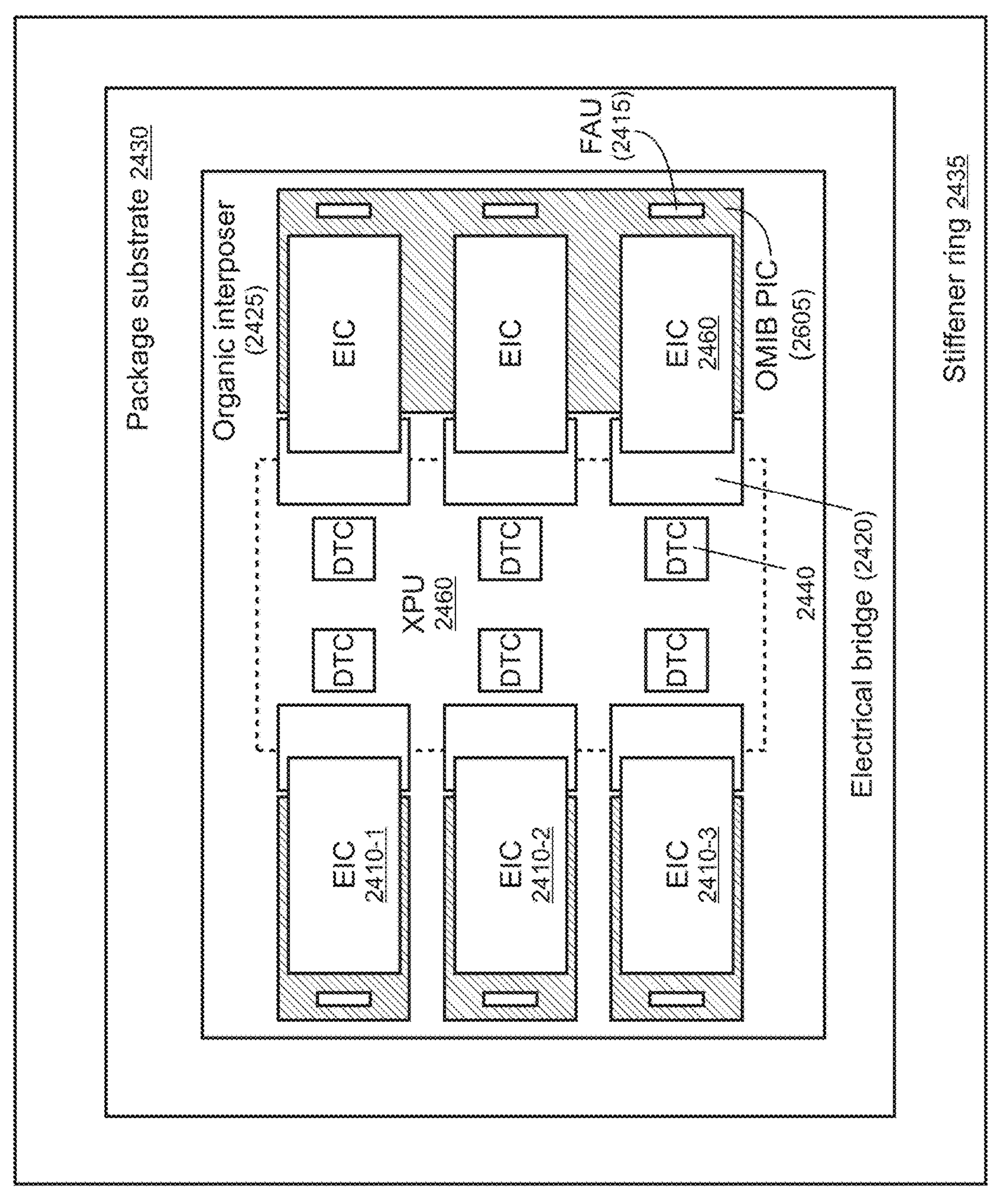
FIG. 26 is a plan view of a third illustrative embodiment of an OMIB SiP having a single XPU die, six EICs, and stitched reticle OMIBs arranged on an organic interposer.

FIG. 26 is a plan view of a third illustrative embodiment of an OMIB SiP 2600 having a single XPU die 2405, six EICs 2410, multiple OMIBs arranged on an organic interposer. This embodiment is similar to the second embodiment except that the individual OMIBs on the right hand side are now combined into a physically larger OMIB 2605. The OMIBs 2410 on the left hand side are shown as being configured as discrete PICs, but it may be appreciated that they can also be combined into a single large OMIB in an alternative embodiment. In another alternative embodiment, all six OMIBs in the previous second embodiment can be combined into a single large OMIB. OMIB 2605 may be implemented using multiple reticles and stitch boundaries as appropriate in consideration of the fabrication process variables discussed above.

FIGS. 27A and 27B show a flowchart 2700 of an illustrative assembly process flow for an OMIB SIP assembly 2800 that is shown in various stages of completion with reference to FIGS. 28-35. The OMIB SiP assembly is substantially similar to the OMIB embodiment shown in FIGS. 24 and 25 and described in the accompanying text. However, it may be appreciated that the assembly process flow may also be adapted to the OMIB embodiments shown in FIGS. 10 and 12.

Unless specifically stated, the methods or steps shown in the flowchart and described in the accompanying text are not constrained to a particular order or sequence. In addition, some of the methods or steps thereof can occur or be performed concurrently and not all the methods or steps have to be performed in a given implementation depending on the requirements of such implementation and some methods or steps may be optionally utilized.

In accordance with the present principles, the assembly process flow uses an RDL-first approach in which various integrated circuits including, for example, XPU(s), chiplets, and/or EICs, are attached last and the organic interposer is fabricated before a top die flip chip attachment process. In this workflow, the OMIB SiP 2800 is initially fabricated with the frontside face-down on a glass carrier wafer so that the backside of the SiP is face-up. After backside fabrication steps are completed, the SiP is debonded, flipped around, and rebonded to the same or different glass carrier wafer for frontside processing. The temporary bonding and debonding enables safe handling and assembly of OMIB SiP during the various process stages in which the in-process SiP can be fragile and susceptible to damage.

Figures 28, 29:
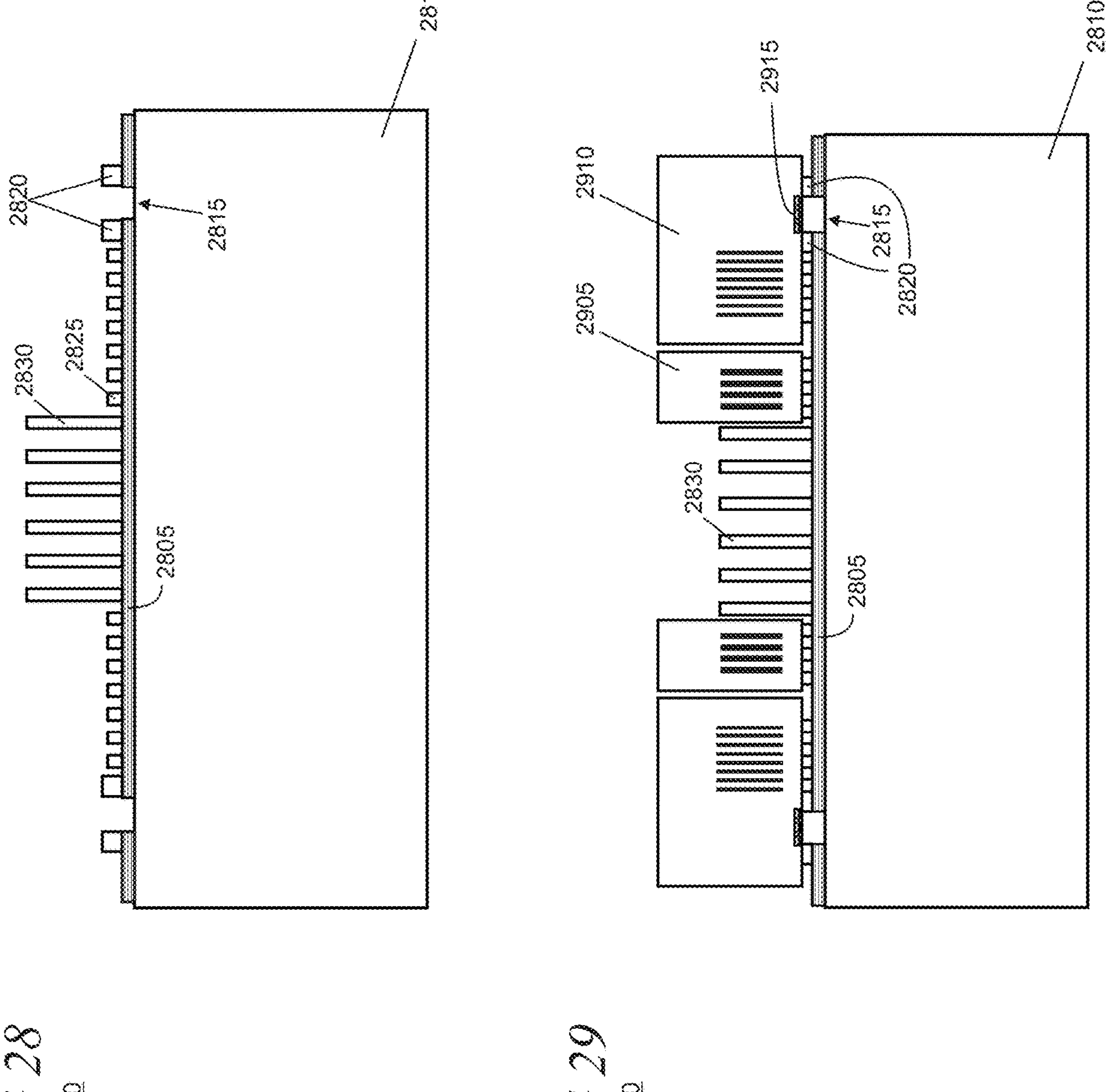
FIGS. 28-35 show elevation views of an illustrative OMIB SiP assembly at various stages of an assembly process flow.

At step 2705 in the flowchart, RDL and passivation layers (PSV) 2805 are fabricated on a glass carrier wafer 2810, as shown in FIG. 28. At step 2710, openings (representatively indicated by reference numeral 2815 are created in the RDL and PSV layers to provide FAU access to grating couplers in the OMIB. PSV dams (representatively indicated by reference numeral 2820), comprising, for example, polyimide materials, are utilized to protect the openings from defects in the subsequent die attach processes.

At step 2715 in the flowchart 2700, electrical interconnects, for example, microbumps (representatively indicated by reference numeral 2825) are formed on the PSV layer 2805 followed by formation of tall copper pillars (representatively indicated by reference numeral 2830). Metrology scans are typically performed to confirm quality, yield, and manufacturing efficiency.

At step 2720 in the flowchart 2700, embedded silicon capacitor such as deep trench capacitors (DTC) (not shown) are die attached. The electrical bridges (representatively indicated by reference numeral 2905) and OMIBs (representatively indicated by reference numeral 2910) are die attached, as shown in FIG. 29. Following the die attach processes, underfill encapsulation is performed using a suitable encapsulant material (not shown), for example, a curable thermosetting material, to protect and stabilize the electrical interconnects (e.g., microbumps) to improve the reliability and service life of the OMIB SiP 2800. As noted above, the FAU openings 2815 are protected by the PSV dam 2820 during the OMIB die attach and underfill encapsulation processes to ensure access to the grating couplers (representatively indicated by reference numerals 2915) in the OMIBs.

Figures 30, 31:
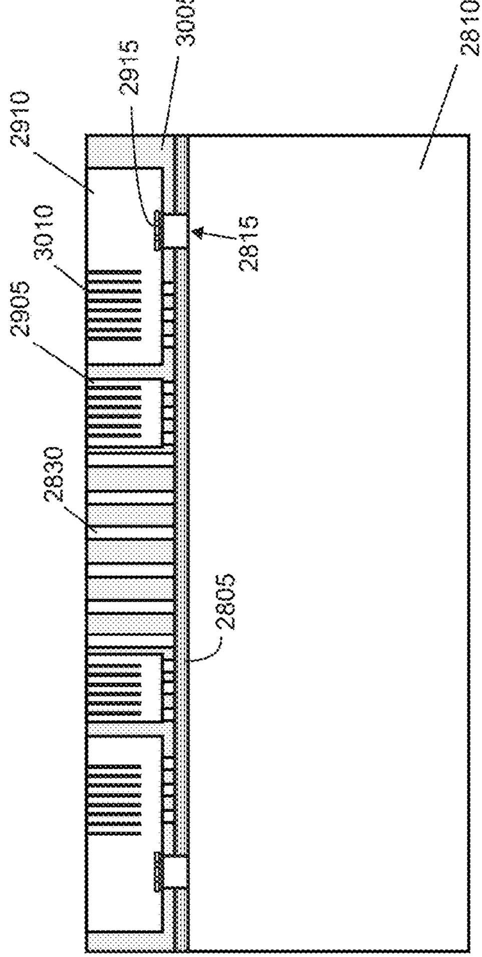

At step 2725 in the flowchart 2700, mold fill processing is performed using a suitable protective material, for example, epoxy molding compound (EMC) 3005, as shown in FIG. 30. The EMC is injected or compressed into a mold cavity surrounding the components (i.e., PICs, EICs, DTCs, copper pillars, etc.) to protect the OMIB SiP 2800. After the EMC is cured, a grinding process is utilized to reveal through silicon vias (TSVs), as representatively indicated by reference numeral 3010. The grinding further exposes the tops of the tall copper pillars 2830.

For example, the silicon of the EICs and PICs is thinned using appropriate mechanical grinding stages such as coarse grinding, fine grinding, and polishing to expose the tops of the TSVs without damaging them. The exposed TSVs are utilized in subsequent backside processing, as discussed below. In some cases, chemical mechanical polishing (CMP) may be utilized as part of a controlled grinding process. Cleaning and chemical etching may also be utilized by chemically removing grinding-induced stress in some implementations.

At step 2730 in the flowchart 2700, additional PSV and RDL layers 3105 are fabricated on top of the exposed mold with exposed TSVs and tall copper pillars, as shown in FIG. 31. At step 2735, electrical interconnects (e.g., microbumps) (representatively indicated by reference numeral 3110) are formed using, for example, controlled collapse chip formation (C4).

Figure 32:
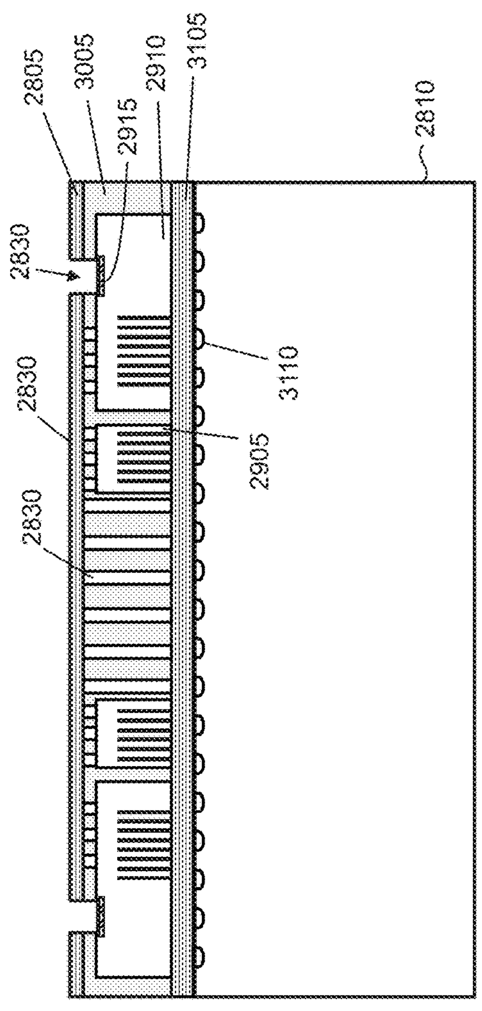

At step 2740 in the flowchart 2700, after the grinding and C4 microbump formation, the glass carrier wafer 2810 is debonded from the frontside of the in-process OMIB SiP 2800. The SiP is repositioned and rebonded such that the frontside and backside are reversed in position with respect to the carrier—the frontside becomes face-up and the backside becomes face-down. Thus, as shown in FIG. 32, the first RDL and PSV layer 2805 is now positioned on the top and the electrical interconnects (e.g., microbumps) are positioned on the bottom and bonded to the glass carrier wafer.

Figure 33:
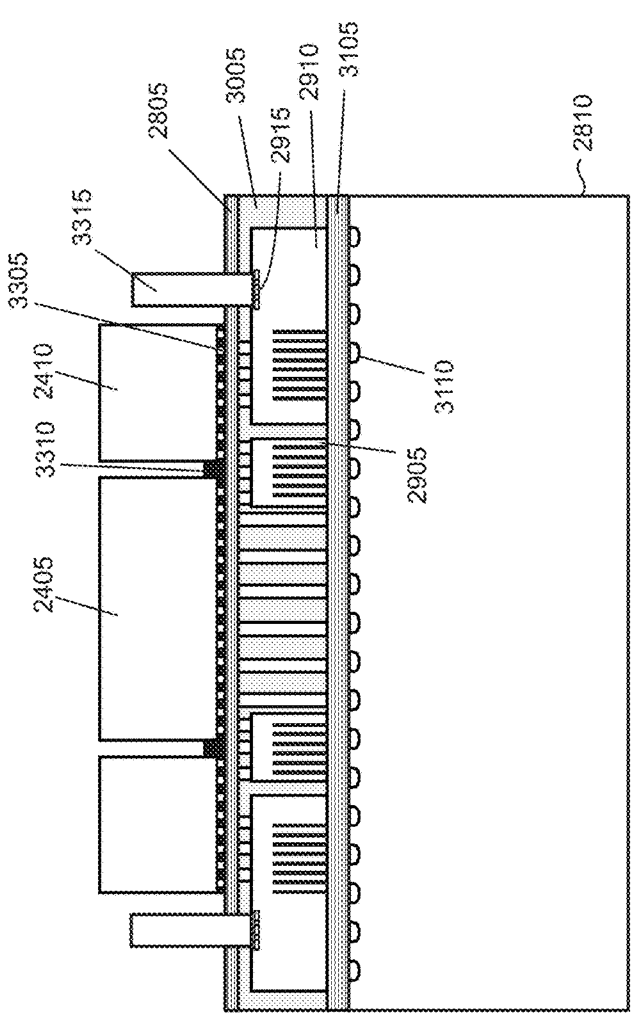

At step 2745 in the flowchart 2700, microbumps (representatively indicated by reference numeral 3305) are formed, followed by die attach of the XPU 2405 and EICs 2410, and underfill encapsulation with a suitable encapsulant 3310, as shown in FIG. 33. At step 2750, optically transparent silicon or glass blocks (representatively indicated by reference numeral 3315), or blocks comprising a combination of glass and optically transparent silicon are attached to the grating coupler 2915 using a optical epoxy through the opening 2830 (FIG. 28) in the RDL and PSV layer that is pre-formed as discussed above.

Figure 34:
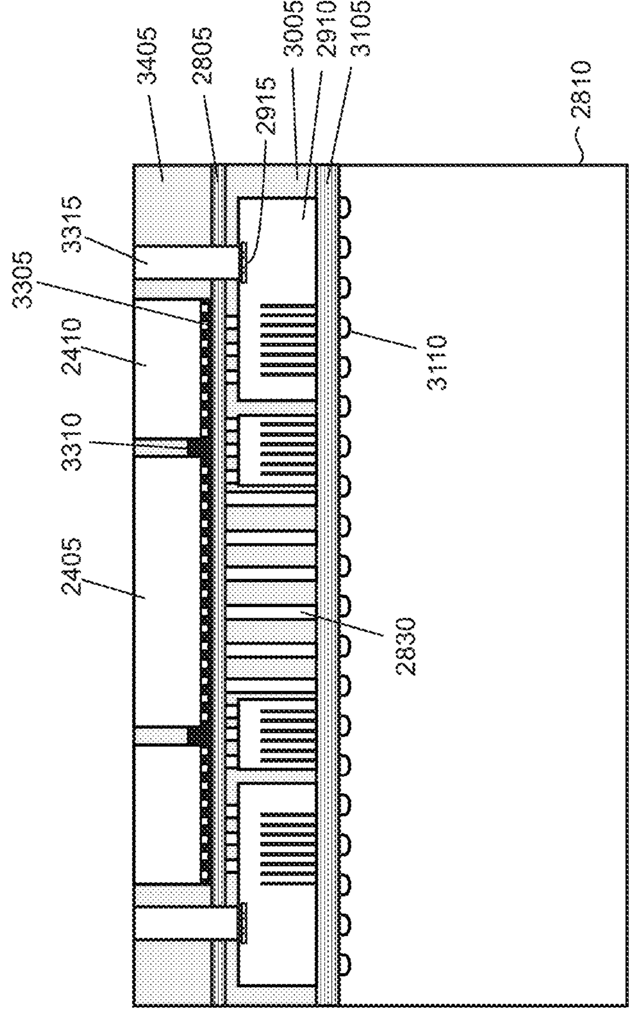

At step 2750 in the flowchart 2700, the OMIB SiP 2800, including the XPU 2405 and EICs 2410 and glass blocks 3315, is encapsulated with a suitable protective material such as EMC 3405, as shown in FIG. 34. At step 2755, after the EMC is cured, a grinding process is utilized to expose the XPU, EICs, and the optical paths to the OMIBs 2910 via the glass blocks 3315 and grating couplers 2915.

Figure 35:
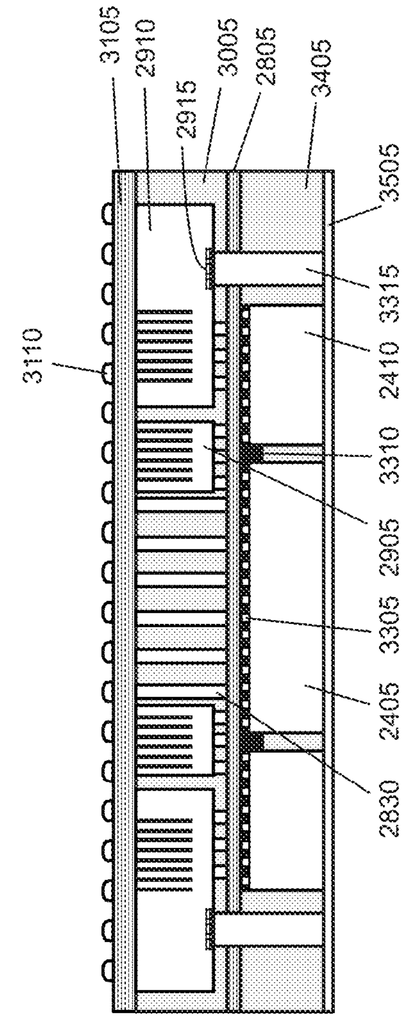

At step 2765 in the flowchart 2700, the backside of the assembly is debonded from the glass carrier wafer 2810, as shown in FIG. 35. The frontside is taped, as shown by reference numeral 3505, prior to singulation processing to separate multiple identical instances of the OMIB SiP on a wafer into individual devices. At step 2770, an OMIB SiP is attached to the package substrate 2430 with stiffener ring 2435 via microbumps 3110. At step 2770, FAUs are attached to the glass to form a finished device, as shown in the elevation view in FIG. 24, as previously discussed.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed:

1. A system-in-package (SiP) fabricated using photolithography, the SiP comprising an electronic integrated circuit (EIC) layer and photonic integrated circuit (PIC) layer that is underneath the EIC layer:

a package substrate on which the PIC layer comprising an optical multi-chip interconnect bridge (OMIB) is disposed;

an optically-enabled bridge comprising the OMIB and implemented in the PIC layer, the optically-enabled bridge supporting an optical chip-to-chip (oC2C) interface to each of a plurality of dies in the EIC layer, the optically-enabled bridge including a plurality of optical devices that are coupled to a photonic network comprising a plurality of photonic paths in the optically-enabled bridge, the photonic network being configured to provide inter-chip optical communications among the plurality of dies, including photonic paths that support inter-die optical communications between edge-adjacent dies and between corner-adjacent dies in an array of the dies; and an analog/mixed signal (AMS) block located in the EIC layer, in which the AMS block is coupled to an optical device in the optically-enabled bridge to provide an oC2C interconnect to a die in the EIC layer, wherein the optically-enabled bridge is a reticle-stitched PIC OMIB, in which a plurality of photolithography reticles are used to expose respective OMIB segments of the optically-enabled bridge during photolithography, and wherein, the OMIB segments are stitched along at least one stitch boundary to form the reticle-stitched OMIB, the stitching including waveguide reticle stitching of photonic network waveguides crossing the stitch boundary.

2. The SiP of claim 1, wherein the segments are stitched along two stitch boundaries.

3. The SiP of claim 2, wherein the optically-enabled bridge segments comprise three discrete segments including two opposing end segments and a center segment.

4. The SiP of claim 3, wherein the two opposing end segments each includes an optical device for the oC2C interconnect.

5. The SiP of claim 3, in which the center segment comprises a plurality of waveguides that implement the photonic paths in the photonic network.

6. The SiP of claim 5, in which stitching comprises waveguide stitching.

7. The SiP of claim 6, in which the waveguide stitching uses an abrupt stitch.

8. The SiP of claim 6, in which the waveguide stitching uses an angled stitch.

9. The SiP of claim 1, in which the AMS block is embedded in a die in the EIC layer.

10. The SiP of claim 1, in which the AMS block is a discrete integrated circuit in the EIC layer.

11. The SiP of claim 1, in which the AMS block comprises a driver and a modulator.

12. The SiP of claim 1, in which the AMS block comprises a SerDes interface.

13. The SiP of claim 1, in which the optically-enabled bridge comprises a multiplexer/demultiplexer that is coupled to an optical device, the multiplexer/demultiplexer being configured to perform wavelength division multiplexing (WDM).

14. The SiP of claim 1, in which the optically-enabled bridge comprises a grating coupler coupled to an optical device via the photonic network, the grating coupler interfacing with fiber array unit (FAU) and fiber bundle to enable connectivity with an external light engine or to enable off-package communications.

15. The SiP of claim 1, in which the dies comprise a 2n array in the EIC layer.

16. The SiP of claim 15, in which the photonic network in the optically-enabled bridge enables inter-chip optical communications among the dies.

17. The SiP of claim 16, in which the photonic network comprises directional photonic paths that are configured to support inter-die optical communications between edge-adjacent dies and between corner-adjacent dies.

18. The SiP of claim 1, in which the package substrate comprises an organic interposer.

19. The SiP of claim 1, in which the optical device in the optically-enabled bridge in the PIC layer is located directly underneath a point of compute of an die in the EIC layer.

20. The SiP of claim 1, in which the optical device is a photonic transceiver comprising a photodetector and an electro-absorption modulator.

* * * * *